US011437283B2

(12) United States Patent
Lilak et al.

(10) Patent No.: US 11,437,283 B2
(45) Date of Patent: Sep. 6, 2022

(54) BACKSIDE CONTACTS FOR SEMICONDUCTOR DEVICES

(71) Applicant: INTEL CORPORATION, Santa Clara, CA (US)

(72) Inventors: Aaron D. Lilak, Beaverton, OR (US); Ehren Mannebach, Beaverton, OR (US); Anh Phan, Beaverton, OR (US); Richard E. Schenker, Portland, OR (US); Stephanie A. Bojarski, Beaverton, OR (US); Willy Rachmady, Beaverton, OR (US); Patrick R. Morrow, Portland, OR (US); Jeffery D. Bielefeld, Forest Grove, OR (US); Gilbert Dewey, Beaverton, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 660 days.

(21) Appl. No.: 16/355,195

(22) Filed: Mar. 15, 2019

(65) Prior Publication Data

US 2020/0294998 A1    Sep. 17, 2020

(51) Int. Cl.
*H01L 21/8234*    (2006.01)
*H01L 27/088*    (2006.01)
(Continued)

(52) U.S. Cl.
CPC ........... *H01L 21/823475* (2013.01); *H01L 21/823412* (2013.01); *H01L 21/823431* (2013.01);
(Continued)

(58) Field of Classification Search
CPC ......... H01L 21/8221; H01L 21/823431; H01L 21/823475; H01L 21/823487; H01L 23/481; H01L 23/52395; H01L 27/0203; H01L 27/0688; H01L 27/0886; H01L 29/0649; H01L 29/0673; H01L 29/1079; H01L 29/42392; H01L 29/66477; H01L 29/66666; H01L 29/7827; H01L 29/785;
(Continued)

(56) References Cited

U.S. PATENT DOCUMENTS

2011/0248404 A1*   10/2011  Chiu ................... H01L 21/6835
257/773

* cited by examiner

*Primary Examiner* — Cheung Lee
(74) *Attorney, Agent, or Firm* — Schwabe, Williamson & Wyatt P.C.

(57) ABSTRACT

Backside contact structures include etch selective materials to facilitate backside contact formation. An integrated circuit structure includes a frontside contact region, a device region below the frontside contact region, and a backside contact region below the device region. The device region includes a transistor. The backside contact region includes a first dielectric material under a source or drain region of the transistor, a second dielectric material laterally adjacent to the first dielectric material and under a gate structure of the transistor. A non-conductive spacer is between the first and second dielectric materials. The first and second dielectric materials are selectively etchable with respect to one another and the spacer. The backside contact region may include an interconnect feature that, for instance, passes through the first dielectric material and contacts a bottom side of the source/drain region, and/or passes through the second dielectric material and contacts the gate structure.

25 Claims, 12 Drawing Sheets

(51) Int. Cl.
*H01L 29/78* (2006.01)
*H01L 29/06* (2006.01)
*H01L 23/532* (2006.01)
*H01L 23/48* (2006.01)

(52) U.S. Cl.
CPC ............... *H01L 21/823437* (2013.01); *H01L 21/823481* (2013.01); *H01L 23/481* (2013.01); *H01L 23/53295* (2013.01); *H01L 27/0886* (2013.01); *H01L 29/0649* (2013.01); *H01L 29/0673* (2013.01); *H01L 29/785* (2013.01)

(58) Field of Classification Search
CPC ........ H01L 29/78642; H01L 29/78696; B82Y 10/00; B82Y 40/00
See application file for complete search history.

Fig. 2A  Fig. 2B  Fig. 2C  Fig. 2D  Fig. 2E
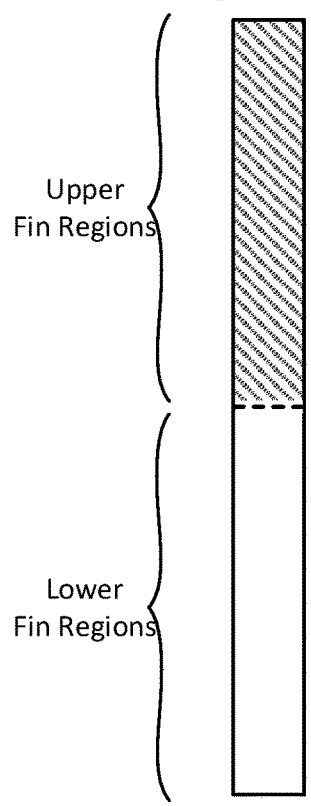
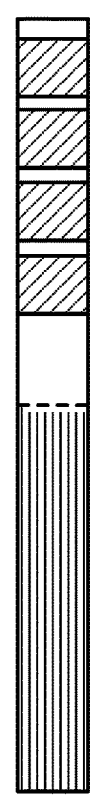
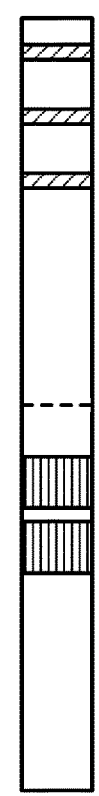
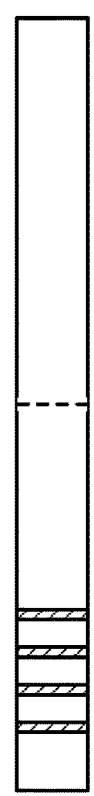
Fig. 2F
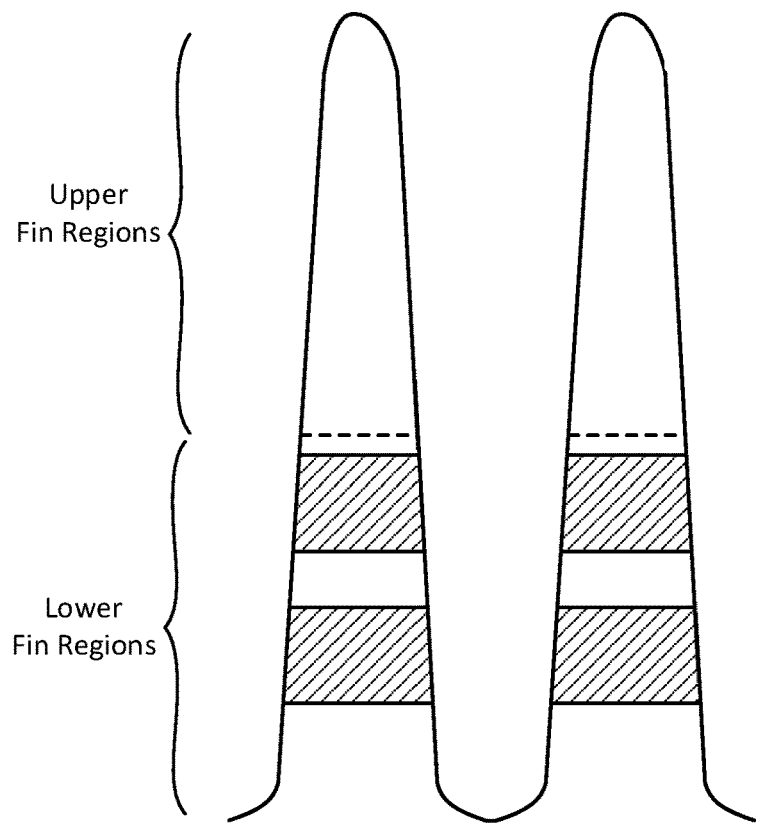

FIG. 8A
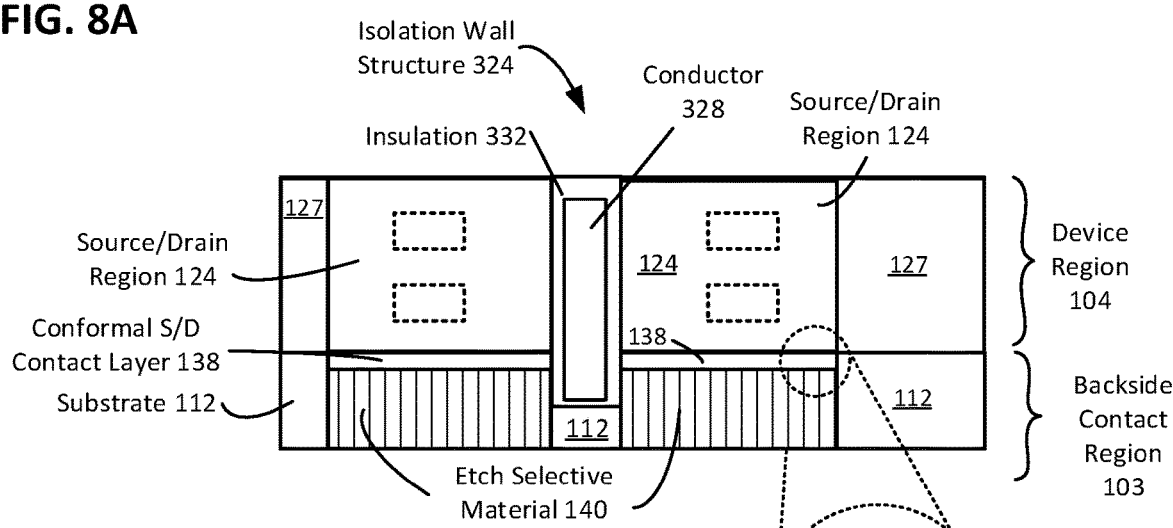
FIG. 8A-1
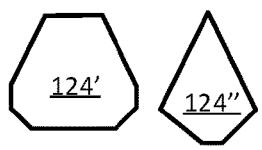
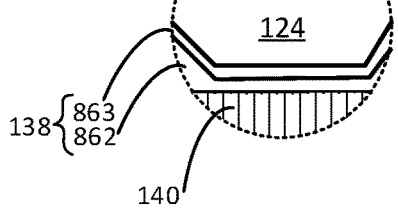
FIG. 8A-2
FIG. 8B
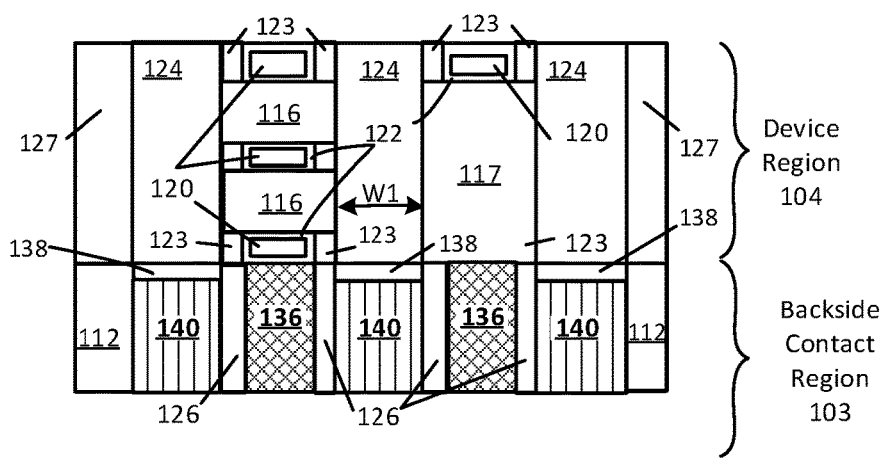

BACKSIDE CONTACTS FOR SEMICONDUCTOR DEVICES

BACKGROUND

Integrated circuitry continues to scale to smaller feature dimensions and higher transistor densities. Three-dimensional (3D) integration increases transistor density by exploiting the Z-dimension, building upwards as well as building laterally outwards in the X and Y dimensions. Another development that can be used for increasingly densely packed semiconductor devices is to establish electrical connections between semiconductor devices using both front side and backside interconnections. Regardless of whether an integrated circuit includes one device layer (or equivalently "device region") or multiple such layers, using backside interconnections can improve various aspects of semiconductor device configuration and performance, particularly with respect to density constraints. Yet there also remain a number of non-trivial issues associated with such backside connections.

BRIEF DESCRIPTION OF THE DRAWINGS

FIGS. 2A-2F illustrate cross-sections of example fin structures that can be used in a stacked transistor configuration in which upper and lower regions of the same fin structure are used simultaneously for separate transistor devices, in accordance with various embodiments of the present disclosure. As will be further appreciated in light of this disclosure, a fin structure that includes only the upper or lower portion of such example fin structures can be used in a non-stacked transistor configuration, in accordance with other embodiments. The cross-sections are taken perpendicular to the fin structures.

FIGS. 3A-9D are various cross-sectional views illustrating various stages of fabrication of backside contacts for an integrated circuit structure, in accordance with some embodiments of the present disclosure. The locations at which the cross-sections are taken vary so as to robustly depict example structural features, and include: vertical cross-sections taken parallel to the gate structure and through the channel regions; vertical cross-sections taken parallel to the gate structure and through the source or drain regions; vertical cross-sections taken perpendicular to the gate structures and through the channel regions; and horizontal cross-sections taken through the backside contact region.

DETAILED DESCRIPTION

Figure 1A:
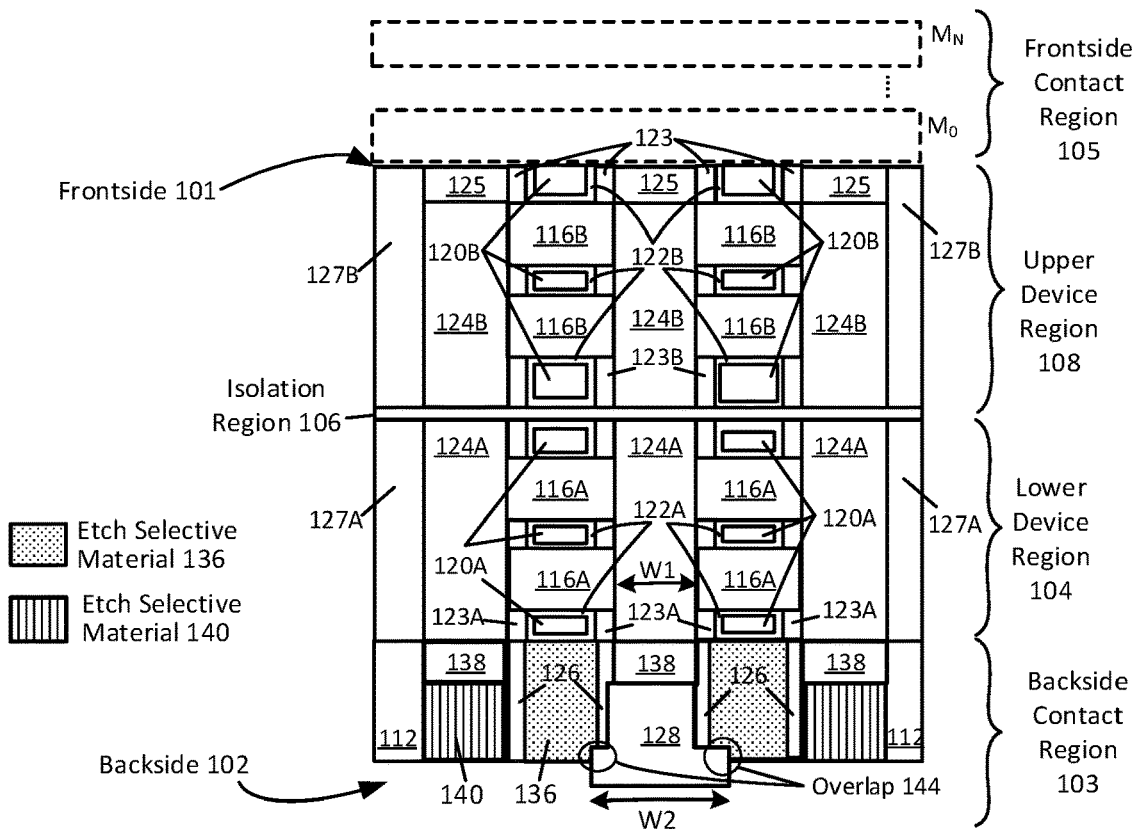
FIG. 1A is a cross-sectional view of an integrated circuit structure having a stacked transistor configuration and that includes multiple etch selective materials and backside interconnect structures, in accordance with an embodiment of the present disclosure. The cross-section is taken perpendicular to the gate structures and through the channel regions.

Backside contact formation techniques and structures are described. The techniques use two or more etch selective materials to facilitate backside contact formation. As will be appreciated in light of this disclosure, the etch selectivity allows for a more forgiving process relative to standard lithography techniques such as extreme ultraviolet (EUV), Argon-Fluoride immersion (ArFi) lithography, or other such techniques that rely on tight lithographic patterning on the backside. In this manner, use of multiple etch selective materials, at least one of which is a dielectric, facilitates a relatively convenient and easier process (as compared to existing methodologies) by which backside contact is made to source/drain regions and/or gate structures, and can also help prevent adjacent conductive structures from shorting to one another due to lithographic and/or patterning process variability. The techniques are particularly well-suited to stacked transistor configurations having multiple device layer strata along the height of a fin structure, but can also be used in non-stacked configurations that have backside contacts. Likewise, the techniques can be applied to both planar and non-planar transistor architectures, including FinFETs (e.g., double-gate and tri-gate transistors), and nanowire or nanoribbon or nanosheet transistors (e.g., gate-all-around transistors). In a more general sense, the techniques provided herein can be used in any integrated circuit structures that include backside contacts, as will be further appreciated in light of this disclosure.

General Overview

As noted above, there remain a number of non-trivial issues associated with forming backside connections. In more detail, backside contact formation is a technique in which a semiconductor substrate is re-oriented to enable processing on and/or through a backside of the substrate that is opposite to the side on which one or more device layers has been fabricated (i.e., the "frontside"). This processing includes using lithographic and patterning techniques to expose a backside surface of one or more of a source region, a drain region, and/or a gate electrode. Once exposed, interconnect structures (e.g., contacts, vias, conformal conductive layers, metal lines) can then be fabricated to establish electrical contact with the exposed backsides of the source region, drain region, and/or gate electrode. Using backside interconnections can be helpful for the fabrication of semiconductor devices, particularly as device density increases and the ability to connect densely packed and tightly spaced devices becomes more challenging. However, standard patterning techniques (e.g., lithographic printing, etching) used to remove backside portions of a substrate so as to expose select backside portions of semiconductor devices may lack the necessary precision and/or accuracy, particularly as scaling continues. For example, given the increasingly tight spacing between adjacent semiconductor devices and the structures within a single device (e.g., a source region, a drain region, and a channel region therebetween), even EUV lithography techniques are susceptible to alignment errors and the formation of undesired electrical connections that short-circuit devices or structures within an integrated circuit. The resulting manufacturing delays and yield loss detract from the appeal of using backside interconnection schemes.

Thus, the present disclosure provides integrated circuit structures that include backside contacts and corresponding formation techniques that help mitigate such issues, according to some embodiments. The structures and techniques described herein use different materials with different etch selectivity to one another. Using different etch selective materials (responsive to different etch chemistries) allows for a relatively loose registration/alignment regime. So, for instance and according to one example embodiment, a first type of etch selective material acts as a mask to protect a first set of features (e.g., source and drain regions), and a second type of etch selective material acts as a mask to protect a second set of features (e.g., gate structures). In such an example case, while a first etch scheme is used to remove the first etch selective material to expose one or more features of the first set to be contacted, the second type of etch selective material protecting the second set of features remains intact (for the most part). Likewise, while a second etch scheme different from the first etch scheme is used to remove the second etch selective material to expose one or more features of the second set to be contacted, the first type of etch selective material protecting the first set of features remains intact (for the most part). If a given etch scheme is selective to a certain material, then that etch scheme tends to remove that material at a much lower rate (e.g., 2× lower, or 3× lower, or 10× lower, or 20× lower, or higher, or possibly not at all) than that etch scheme removes one or more other materials also exposed at the time the etch scheme is carried out. In some embodiments, one or more of the etch selective materials are dielectric materials that also operate to provide electrical insulation (in addition to etch selectivity).

In some example embodiments, non-conductive spacers between the first and second etch selective materials further assist in the selective etch process and provisioning of backside contacts. As will be appreciated, when using etch selective materials that are dielectric or otherwise non-conductive, errors in patterning conductive structures do not necessarily lead to electrical shorting with an adjacent conductive feature or structure. That is, even if a via that connects to source region, a drain region, a gate electrode, or other component of a semiconductor device is large enough to extend toward an adjacent conductive structure, an intervening etch selective dielectric or otherwise non-conductive material will prevent shorting between the two structures. Numerous variations and other embodiments will be appreciated in light of this disclosure.

Example Architecture

Figure 1B:
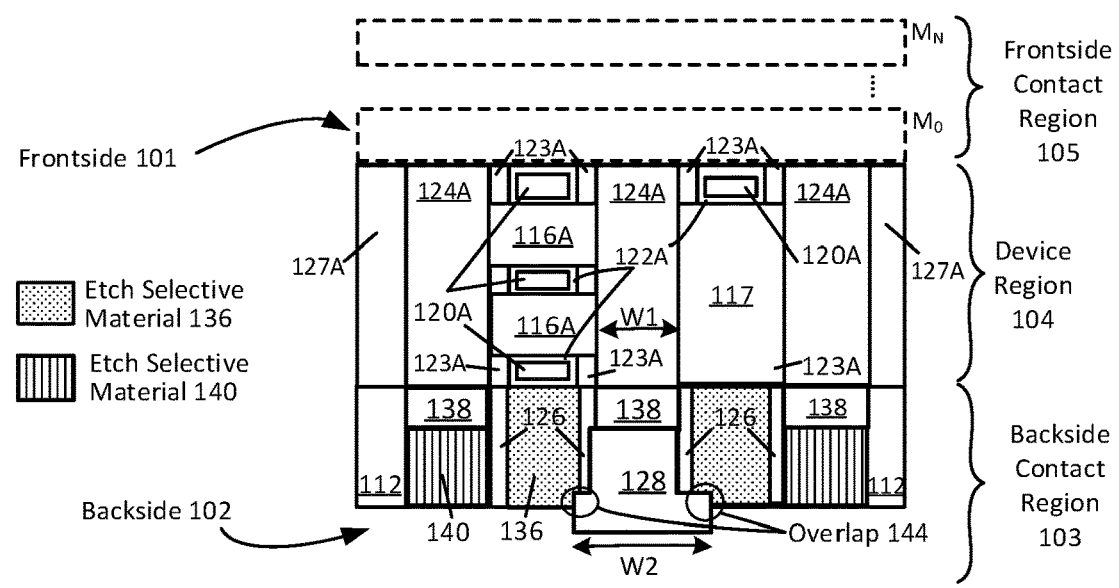
FIG. 1B is a cross-sectional view of an integrated circuit structure having a non-stacked transistor configuration and that includes multiple etch selective materials and backside interconnect structures, in accordance with an embodiment of the present disclosure. The cross-section is taken perpendicular to the gate structures and through the channel regions.

FIGS. 1A and 1B each illustrates a cross-section view of an integrated circuit structure that includes multiple etch selective materials and backside interconnect structures, in accordance with some embodiments of the present disclosure. Both example embodiments are configured with non-planar architecture that include a fin structure and/or nanowires in the channel regions, although the techniques can be used with planar architecture as well. As can be seen, the cross-sections depicted are taken perpendicular to the gate structures and through the channel regions. FIG. 1A shows a stacked transistor architecture that includes nanowires in the channel regions, and FIG. 1B shows a non-stacked or single device layer architecture that includes nanowires in the channel region on the left side of FIG. 1B and a fin in the channel region on the right side of FIG. 1B. Similarities between the two architectures, including the backside contacts, will be apparent.

As can be seen with reference to FIG. 1A, the example integrated circuit includes a stacked transistor configuration that includes upper and lower portions separated by an isolation region 106, and wherein the channel regions of the fin structure have been processed into nanowires. In particular, the upper portion of the fin structure is part of an upper device region 108, and the lower portion of the fin structure is part of a lower device region 104. A lower gate structure of the lower device region 104 is wrapped around nanowires 116A and includes gate dielectric 122A and gate electrode 120A, and an upper gate structure of the upper device region 108 is wrapped around nanowires 116B and includes gate dielectric 122B and gate electrode 120B. Likewise, the lower device region 104 includes source and drain regions 124A adjacent to the nanowires 116A, and the upper device region 108 includes source and drain regions 124B adjacent to the nanowires 116B. Frontside contacts 125 are provided on the source/drain regions 124B, and this example embodiment further includes insulator material adjacent the source/drain regions 127B. As can be further seen, a backside contact region 103 is applied to the backside 101 of the structure, which in this example embodiments includes source/drain contacts 138, a first etch selective material 138, a second etch selective material 140, spacers 126, and an interconnect feature 128. Likewise, a frontside contact region 105 can be applied to the frontside 101 of the structure, which may include local contacts and/or interconnects, along with one or more interconnect or metallization layers (e.g., metal layers M1-MN, shown in dashed lines in FIGS. 1A-B) and intervening passivation or etch stop layers, if so desired.

The integrated circuit of FIG. 1B includes a non-stacked transistor configuration that is similar, for example, to the lower device region 104 of FIG. 1A. The related relevant discussion will equally apply to both structures.

Although only a single fin structure and two gate structures are shown in each of FIGS. 1A-B, any number of fin structures and gate structures can be used, as will be appreciated. The fin structure shown in FIGS. 1A-B includes two nanoribbons, however, any number of nanoribbons or distinct channel regions may be utilized in each fin structure. In addition, other embodiments may have fins in the channel region rather than nanowires, or some other combination of fins, nanowires and/or nanoribbons and/or nanosheets, as will be further appreciated. Note that complementary circuits in the stacked architecture may include, for instance, p-type devices in the upper fin portions and n-type devices in the lower fin portions, or vice-versa, although other embodiments may include different arrangements (e.g., both upper and lower portion are n-type or p-type, or alternating fin structures have alternating polarities). Likewise, complementary circuits in the non-stacked architecture may include p-type fins and n-type fins in alternating pattern, although other embodiments may include different arrangements (e.g., all n-type or p-type fins, or groups of p-type or n-type fins or fin-pairs, etc). Any number of other configurations will be apparent and can benefit from the backside techniques provided herein.

The substrate 112 can have any number of standard configurations, such as bulk substrates, semiconductor-on-insulator substrates, or multilayer substrates. In some example embodiments, substrate 112 can be, for instance, a bulk silicon or germanium, or gallium arsenide substrate. In other embodiments, substrate 112 can be a multilayer substrate configuration, such as a silicon-on-insulator (SOI) substrate). In other embodiments, substrate 112 is optional or otherwise removed at some point in the process. For instance, in some embodiments, substrate 112 is removed after lower and upper device regions are formed so as to allow for further desired processing under the lower device region, such as formation of a backside contact region 103 as variously described herein. In other embodiments, the backside contact region 103 can be formed within substrate 112, if not completely removed.

The fin structures in either the stacked or non-stacked architecture may be configured in any number of ways, including fins native to substrate 112, replacement fins or fin structures, and/or multilayer structures suitable for forming nanowires (or nanoribbons or nanosheets, as the case may be; all of which can be generalized to nanowires for ease of discussion). For example, in a stacked architecture, upper fin portions may comprise, for instance, a first semiconductor material, while bottom fin portions may comprise a second semiconductor material compositionally different from the first semiconductor material. In another example stacked architecture, the upper fin portion may be comprised of a semiconductor material with one crystal orientation, while the bottom fin portion may be comprised of the same semiconductor with a different crystal orientation. Example semiconductor materials include, for instance, silicon, germanium, silicon germanium (SiGe), a semiconducting oxide such as indium gallium zinc oxide (IGZO), indium gallium arsenide (InGaAs), indium arsenide (InAs), gallium antimonide (GaSb), or other suitable semiconductor material. Alternatively, upper and lower fin portions may comprise the same semiconductor materials and configuration. FIGS. 2A-F show various example fin structures that can be used in a stacked architecture, and will be discussed in turn. Any such structures shown in FIGS. 2A-F can be substituted into FIG. 1A. As will be further appreciated with respect to non-stacked architecture, any top half or bottom half of such structures shown in FIGS. 2A-F can be substituted into FIG. 1B.

Isolation 106 electrically isolates the upper and lower device regions 108 and 104, and can be implemented, for example, with an insulator layer (e.g., oxide or nitride), or by way of doping or fixed charge isolation. Insulator 127A-B adjacent isolation 106 can be any suitable insulator material, such as silicon dioxide, silicon nitride, silicon carbide, silicon oxynitride, a polymer, a porous version of any of these, or any combination of these (e.g., upper portion of silicon oxide and a lower portion of silicon nitride, or vice-versa). In some embodiments, isolation 106 and insulator 127A-B are the same material, while in other embodiments they are compositionally different to facilitate formation of upper and/or lower device region features (e.g., so as to provide etch selectivity between the two materials, such as for an etch that removes insulator 127A-B but not isolation region 106, or vice-versa). Numerous such configurations and variations will be apparent in light of this disclosure.

In the example embodiment shown, the upper and lower gate electrodes are electrically isolated from one another by isolation region 106. In still other embodiments, at least one set of upper and lower gate electrodes can be electrically connected to one another through isolation region 106. In addition to gate dielectrics 122A-B and gate electrodes 120A-B, the upper and lower gate structures further include gate spacers 123A-B. Any number of gate structure configurations can be used. The gate spacers 123A-B may be, for example, silicon nitride or silicon dioxide or a carbon-doped oxide or an oxynitride or a carbon-doped oxynitride. The gate dielectrics 122A-B may be, for example, any suitable gate dielectric material(s) such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out to improve gate dielectric quality when a high-k material is used. Further, the gate electrodes 120A-B may comprise a wide range of suitable metals or metal alloys, such as aluminum, tungsten, titanium, tantalum, copper, titanium nitride, ruthenium, or tantalum nitride, for example.

In some embodiments, the gate dielectrics 122A-B and/or gate electrodes 120A-B may include a multilayer structure of two or more material layers or components. For instance, in one such embodiment, the gate dielectric structures 122A or B (or both) is a bi-layer structure having a first dielectric material (e.g., silicon dioxide) in contact with the corresponding channel region and a second dielectric material (e.g., hafnium oxide) in contact with the first dielectric material, the first dielectric material having a dielectric constant that is lower than the dielectric constant of the second dielectric material. Likewise, the gate electrode structures 120A or B (or both) may include a central metal plug portion (e.g., tungsten) with one or more outer work function layers and/or barrier layers (e.g., tantalum, tantalum nitride, an aluminum-containing alloy), and/or a resistance reducing cap layer (e.g., copper, gold, cobalt, tungsten). In some embodiments, the gate dielectrics 122A-B and/or gate electrodes 120A-B may include grading (increasing or decreasing, as the case may be) of the concentration of one or more materials therein.

Further note that the gate structure of the upper device region 108 may be the same as the gate structure of the lower device region 104, or different. In some example embodiments, for instance, the gate electrode 120B of the upper gate structure includes a p-type work function metal suitable for PMOS devices, while the gate electrode 120B of the lower gate structure includes an n-type work function metal suitable for NMOS devices. Likewise, the gate dielectric 122B of the upper gate structure may include a first gate dielectric material, while the gate dielectric 122A of the lower gate structure includes a second gate dielectric material compositionally different from the first. In any such cases, the upper and lower gate dielectric structures 122A-B may be employed with intentionally different thicknesses to be tuned for different types of transistor devices. For instance, the relatively thicker gate dielectric may be used for a high voltage transistor device, while the relatively thinner gate dielectric may be used for a logic transistor device.

Source and drain regions 124A-B may be implemented with any number of standard processes and configurations. As can be seen in this example embodiment, the source/drain regions are epitaxial source/drain regions that are provided after the relevant portion of the fin or fin structure was isolated and etched away or otherwise removed. The source/drain material can therefore be compositionally different from the underlying fin structure or substrate 112 material and/or the channel material. In addition to the standard source/drain forming process, note that an etch selective material 356 (as will be described in turn with reference to FIGS. 3B-C) can be deposited in the source/drain trench prior to the desired source/drain materials for source/drain regions 124A. The depth of the etch selective material 356 can be set with an etch back process, or otherwise deposited at the desired level. The shape of the source/drain regions can vary greatly, depending on process employed.

For instance, in some embodiments, the source/drain region trench bottoms used to form source/drain regions 124A are faceted, which in turn makes etch selective material 356 take on the faceted shape, which is in turn imparted to the bottom of source/drain regions 124A. In another example, the etch selective layer 356 may take on a rectangular shape, but the source/drain regions 124B may take on a faceted shape due to the preferential growth rate of epitaxial materials in certain crystalline orientations. In some such example cases, an airgap or voided region may be incorporated in some region between the etch selective material 356 and the source/drain material 124B due to this faceting of the source/drain material 124B. In another example case, the source/drain regions 124B may be overgrown from their respective trenches and faceted at a top portion, and the corresponding source or drain contact structure 125 lands on that faceted excess portion. Alternatively, in other embodiments, any top faceted excess portion of epi source/drain regions 124A and/or 124B can be removed (e.g., via chemical mechanical planarization, or CMP). As will be further appreciated, in some embodiments, the removal of the original source/drain regions and replacement with epi source/drain material may result in an upper portion of the source/drain region (the overgrowth portion of the epi deposition) which is wider (e.g., by 1-10 nm) than the underlying fin structure width. Any combination of such features may result.

Source/drain regions 124A and/or 124B can be any suitable semiconductor material. For instance, PMOS source/drain regions may include, for example, group IV semiconductor materials such as silicon, germanium, SiGe, germanium tin (GeSn), SiGe alloyed with carbon (SiGe:C). Example p-type dopants in silicon, SiGe, or germanium include boron, gallium, indium, and aluminum. NMOS source/drain regions may include, for example, group III-V semiconductor materials such as two or more of indium, aluminum, arsenic, phosphorus, gallium, and antimony, with some example compounds including but not limited to indium aluminum arsenide (InAlAs), indium arsenide phosphide (InAsP), InGaAs, indium gallium arsenide phosphide (InGaAsP), GaSb, gallium aluminum antimonide (GaAlSb), indium gallium antimonide (InGaSb), or indium gallium phosphide antimonide (InGaPSb). Example N-type dopants include phosphorus, arsenic, and antimony in silicon, germanium, or SiGe. In a more general sense, source/drain regions can be any semiconductor material suitable for a given application. In some specific such example embodiments, for instance, source/drain regions 124A and/or 124B comprise SiGe (e.g., $Si_{1-x}Ge_x$ where $0.20 \leq x \leq 0.99$; or $Si_xGe_y$:$C_z$ where $8 \leq x \leq 16$; $80 \leq y \leq 90$; $1 \leq z \leq 4$; $x+y+z=100$). In another embodiment, source/drain regions 124A comprise an indium-containing compound (e.g., $In_yAl_{1-y}As$ where $0.60 \leq y \leq 1.00$; or $InAs_yP_{1-y}$ where $0.10 \leq y \leq 1.00$; $In_yGa_{1-y}As_zP_{1-z}$ where $0.25 \leq y \leq 1.00$ and $0.50 \leq z \leq 1.00$; $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$).

In some embodiments, the source/drain regions 124A and/or 124B may include a multilayer structure, such as a germanium cap on a SiGe body, or a germanium body and a carbon-containing SiGe spacer or liner between the corresponding channel region and that germanium body. In any such cases, a portion of the source/drain regions 124A and/or 124B may have a component that is graded in concentration, such as a graded germanium concentration to facilitate lattice matching, or a graded dopant concentration to facilitate low contact resistance. Any number of source/drain configurations can be used as will be appreciated, and the present disclosure is not intended to be limited to any particular such configurations.

Source and drain contact structures 125 can also be included in the final structure, as will be further apparent. Note that, even though bottom contacts are provisioned for source/drain regions 124A, those source/drain regions 124A may also have a frontside contact similar to contacts 125. Source/drain contact structures 125 can have any number of standard configurations. In some example embodiments, the contact structures 125 include a contact metal and a conductive liner or barrier layer, deposited in a contact trench formed in an insulator layer over the source and drain regions 124B. The liner can be, for example, tantalum or tantalum nitride, and metal can be any suitable plug/core material, such as tungsten, aluminum, ruthenium, cobalt, copper, or alloys thereof. In some cases, the contact structures 125 can be optimized p-type and n-type contact structures similar to p-type and n-type gate electrode structures. For instance, according to some such embodiments, the liner can be titanium for NMOS source/drain contact structures, or nickel or platinum for PMOS source/drain contact structures. In still other embodiments, the contact structures 125 may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of suitable source/drain contact structures can be used in accordance with an embodiment of the present disclosure, and the present disclosure is not intended to be limited to any particular such contact structure configurations.

As can be further seen in FIGS. 1A-B, a frontside 101 and a backside 102 are indicated, reference to which in the following description may facilitate explanation. It will be appreciated that the frontside 101 and backside 102 can refer generally to the corresponding surfaces of an integrated device structure as a whole, corresponding surfaces of individual structures within the integrated device structure (e.g., source region, drain region, gate structure), a substrate, and combinations thereof. It will be further appreciated that the techniques described herein are applicable to any configuration of semiconductor device, whether a single device layer (e.g., only the lower device region 104, such as shown in FIG. 1B), two device layers (e.g., both of device layers 104, 108, such as shown in FIG. 1A), or more. In examples in which two or more device layers are present, the stacked configuration can be fabricated using any number of integration schemes. In some examples, the stacked device layers can be formed through fabrication involving a single fin structure that includes an isolation region 106 between the upper device region 108 and the lower device region 104 (such as the examples shown in FIGS. 2A-F). In other examples, the stacked device layers can be formed through separate fabrication of device layers that are stacked and bonded together using a bonding material, to provide a monolithic structure. In such cases, note that the bonding material (e.g., silicon nitride, silicon oxide SiO$_x$) may further act as an isolation region 106.

As can further be seen, contacts 138 are formed on the backside of source/drain regions 124A, followed by formation of etch selective material 140. The etch selective material 140 in some examples can be a dielectric material, but this is not required as will be apparent in light of the following description. As can be further seen in this particular example embodiment, a backside interconnect 128 is formed to contact the backside of the middle source/drain region 124A by way of the corresponding contact 138. Note that the backside interconnect 128 can overlap adjacent areas, such as overlap areas 144 indicated in FIGS. 1A-B. To this end, the width W2 is sufficient that the conductive material of the interconnect 128 makes contact with spacer 126 and etch selective material 136. However, because spacer 126 and etch selective material 136 are dielectric materials, the interconnect 128 does not short to these neighboring structures or other adjacent conductive structures covered by spacer 126 and etch selective material 136. Thus, while the backside interconnect 128 is formed from a conductive material that would form an electrical short with an adjacent conductive material (e.g., a source region, a drain region, an interconnect/contact, or other conductive structure), such shorting is avoided using techniques described herein, according to some embodiments. In addition, the etch selective material 136 is etch selective relative to etch selective material 140, with respect to a given etchant, and spacers 126 are etch selective to both materials 136 and 140 for their respective etchants, as will be further explained in turn with reference to the various example embodiments depicted in FIGS. 3A through 9D.

The integrated circuits as shown in FIGS. 1A-B may include other features as well, as will be appreciated. For example, the structures may further include interconnect features and layers. For instance, in a stacked configuration such as shown in FIG. 1A, a first vertical interconnect feature can be provisioned that connects a given upper source or drain region 124B to the corresponding lower source or drain region 124A. Likewise, as previously explained, a frontside contact region 105 may be included, such as local contacts and interconnects, as well as one or more metallization layers formed over the local contacts/interconnects. Such metallization layers, generally shown in dashed lines over the frontside 101, are sometimes called the backend of line or so-called BEOL (not to be confused with backside contacts and interconnect structures). A BEOL structure may be distinct from, or include, the local contacts and interconnect directly above the frontside 101, and may include any number of distinct interconnect/metallization layers (e.g., M$_0$ through M$_N$), but in some such embodiments include, for instance, nine to twelve distinct such layers. Such interconnect features and layers can be provisioned, for example, using standard lithographic and masking operations, and standard deposition (e.g., CVD, ALD, etc). Another feature that may be included is an isolation wall structure that is provisioned between two fin structures, to help electrically isolate those two fins. In some such cases, the isolation wall may include an internal conductor covered in insulation material, wherein the internal conductor can be used for routing power and signals, for example. Further note that while the fin structures are shown with an idealized state (e.g., perfectly vertical sidewalls and perfectly horizontal tops and bottoms), all such geometry could be rounded or tapered or otherwise non-ideal. For instance, the fin structures could be trapezoidal in shape, or hourglass shaped, or some other shape, as a result of the forming processes.

As will be appreciated, the use herein of expressions such as "channel region" or "channel structure" or "active semiconductor channel structure" or "source region" or "source structure" or "drain region" or "drain structure" simply refers to specific locations of a transistor structure, and is not intended to imply that the transistor itself is currently electrically biased or otherwise in a conductive state where carriers are mobile within the channel region, as will be plainly apparent. For instance, a given transistor need not be connected (whether directly or indirectly) to any power source whatsoever to have a channel region or a channel structure, or source and drain regions or structures. Further note that semiconductor material making up a fin, nanowire, nanoribbon, nanosheet, channel region or structure, source region or structure, or drain region or structure may be referred to herein as a body of or comprising one or more semiconductor materials. Likewise, insulator material making up an insulative structure or region such as a shallow trench isolation (STI) layer or structure, dielectric layer or structure, interlayer dielectric (ILD) structure, gate dielectric, gate spacer, or dielectric capping layer may be referred to herein as a body of or comprising one or more insulator materials. Likewise, conductive material making up a conductive structure or region such as a via structure, conductive line, conductive layer or structure, conductive plug, or conductive feature may be referred to herein as a body of or comprising one or more conductive materials.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of a backside interconnect structure that utilizes etch selective materials and spacers, as variously described herein. For example, SEM/TEM imaging can be useful to show a cross-section cut perpendicular to a gate structure showing backside interconnect features under the gate and/or source/ drain regions of the device, as variously described herein. For instance, such a cross-section image may reveal the presence/shape of spacer material between gate and source/ drain backside interconnect features (whether those features include metal or insulator or both), according to some embodiments. In some embodiments, such a cross-section image may reveal the presence of different materials below the source, drain, and channel regions (e.g., some locations would have remnants of etch selective materials and some would have metal, and some may have both, according to some embodiments. In some embodiments, a cross-section image may further reveal a bottom side metal contact conformal to faceted epitaxial source and/or drain regions. Numerous other configurations and variations will be apparent in light of this disclosure.

It is noted that designations such as "above" or "below" or "top" or "bottom" or "top side" or "bottom side" or "top portion" or "bottom portion" or "frontside" or "backside" or "top surface" or "bottom surface" or "uppermost surface" or "bottom most surfaced" are not intended to necessarily implicate a fixed orientation of an integrated circuit structure provided herein or otherwise limit the present disclosure. Rather, such terminology is simply used in a relative sense to consistently describe a structure as it depicted or illustrated herein. As will be appreciated, structures provided herein can be rotated or oriented in any manner, such that a top side or surface becomes for instance a left-facing sidewall or a bottom side or surface, and a bottom side or surface becomes for instance a right-facing sidewall or a top side or surface. Any such structures having an alternate orientation relative to what is depicted herein still remain an embodiment of the present disclosure.

Stacked Source and Drain Regions

FIGS. 2A through 2F illustrate cross-sections of example fin structures that can be used in a stacked transistor configuration, such as the example shown in FIG. 1A, in which upper and lower regions of the same fin structure are used simultaneously for separate transistor devices, in accordance with an embodiment of the present disclosure. Also, as previously noted, any top half or bottom half of such structures shown in FIGS. 2A-F can be used for fin structures shown in FIG. 1B. The cross-sections are taken perpendicular to the fin structures. Note that the cross-hatching of the features/layers is provided merely to assist in visually distinguishing features/layers. To this end, further note that the materials depicted with cross-hatching in FIGS. 2A-F are not intended to be the same materials depicted with cross-hatching in FIGS. 1A-B and 3A-9D.

As can be seen, each of the fin structures generally includes an upper fin region and a lower fin region. As can further be seen, each of these upper and lower fin regions may include a fin, or one or more nanowires (separated by sacrificial material), or one or more nanoribbons or nanosheets (separated by sacrificial material). In between the upper and lower fin regions is an isolation region, generally indicated with a dashed line (e.g., isolation region 106). The fin structures may have any number of geometries, but in some example cases are 50 nm to 250 nm tall (e.g., 55 nm to 100 nm), and 5 nm to 25 nm wide (e.g., 10 nm to 15 nm). The isolation region between the upper and lower fin regions may be implemented, for example, with an intervening insulation layer or doping integrated into either or both the upper or lower fin regions proximate the dashed line area. The fin structures can be formed using standard processing, such as blanket deposition of the various layers making up the structure, followed by patterning and etching into the individual fins structures.

FIG. 2A illustrates a fin structure having an upper fin region comprising a first semiconductor material (diagonal cross-hatching), and a lower fin region comprising a second semiconductor material that is compositionally different from the first semiconductor material. FIG. 2B illustrates a fin structure having an upper fin region that includes four nanowires comprising a first semiconductor material (diagonal cross-hatching), and a lower fin region comprising a second semiconductor material (vertical cross-hatching) that is compositionally different from the first semiconductor material. Note that the nanowires are positioned in the fin structure so as to be closure to the top of the upper fin region. FIG. 2C illustrates a fin structure having an upper fin region comprising a first semiconductor material, and a lower fin region that includes four nanowires comprising a second semiconductor material (diagonal cross-hatching) that is compositionally different from the first semiconductor material. In this example case, note that the nanowires are positioned in the fin structure so as to be closure to the top of the lower fin region.

FIG. 2D illustrates a fin structure having an upper fin region that includes three nanoribbons comprising a first semiconductor material (diagonal cross-hatching), and a lower fin region that includes two nanowires comprising a second semiconductor material (vertical cross-hatching) that is compositionally different from the first semiconductor material. In this example case, note that the nanoribbons are positioned in the fin structure so as to be closure to the top of the upper fin region, and the nanowires are positioned in the fin structure so as to be closure to the top of the lower fin region. FIG. 2E illustrates a fin structure having an upper fin region comprising a first semiconductor material, and a lower fin region that includes four nanoribbons or nanosheets comprising a second semiconductor material (diagonal cross-hatching) that is compositionally different from the first semiconductor material. In this example case, note that the nanoribbons or nanosheets are positioned in the fin structure so as to be closure to the bottom of the lower fin region. Another example embodiment may be where the upper and lower fin regions are the same material (one continuous fin of the same semiconductor material) or otherwise configured in a similar manner, such as the lower region of FIG. 2A and the upper region of FIG. 2E in one such example case, or the upper region of FIG. 2B and the lower region of FIG. 2C in another example case.

FIG. 2F shows a fin-pair, which includes two fin structures. Each fin structure can be configured in any number of ways, as indicated in the examples of FIGS. 2A-2E. In this example case, each fin structure is similarly configured and has an upper region comprising a first semiconductor material, and a lower region that includes two nanowires comprising a second semiconductor material (diagonal cross-hatching) that is compositionally different from the first semiconductor material. Note the tapering of the fins. Further note the curved trough bottom between the fins, as well as the round top of the fin structure. Such tapering and rounding may result from the fin forming process, and may vary from one fin to the next. In some embodiments, for instance, the fin shape of the two fins may differ due to processing and layout patterning effects such that the taper of the outer side of the left fin differs from the taper of the outer edge of the right fin.

Further note that the example fin structures shown each includes an upper fin portion having opposing sidewalls and a lower fin portion having opposing sidewalls, and the sidewalls of the upper fin portion are collinear with the sidewalls of the lower fin portion. This is one example sign that is indicative of a common or single fin structure that is being used for top and bottom transistor devices arranged in a stacked configuration, according to some embodiments provided herein. Other fin structure configurations may have curved or hourglass profiles, but still generally provide a degree of collinearity or self-alignment between the upper and lower fin portions, as will be appreciated. In still other embodiments, such as where the stacked device layers are formed through separate fabrication of device layers that are then stacked and bonded together using a bonding material, note that that there may be no such collinearity between the upper and lower sidewalls.

It will be appreciated that the techniques described herein can be applied to a multitude of different transistor devices which include, but are not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

In addition, in some embodiments, the techniques may be used to benefit transistors including planar and/or non-planar configurations, where the non-planar configurations may include finned or FinFET configurations (e.g., dual-gate or tri-gate), gate-all-around configurations (e.g., nanowire) or some combination thereof (e.g., a beaded-fin configurations), to provide a few examples. Further, the techniques may be used to benefit complementary transistor circuits, such as complementary MOS (CMOS) circuits, where the techniques may be used to benefit one or more of the included n-channel and/or p-channel transistors making up the CMOS circuit. As described herein, some examples include stacked CMOS circuits in which n-channel and p-channel devices are in separate layers along the height of a fin structure, while some other examples include non-stacked CMOS circuits in which n-channel and p-channel devices are in separate regions of a single device layer.

Methodology and Architecture

FIGS. 3A-9D illustrate various cross-sections selected to show progressive fabrication of an integrated circuit device, according to some embodiments of the present disclosure. As will be apparent, the example structures shown are with respect to non-stacked transistor configurations, but the methodology equally applies to stacked configurations as previously explained. The focus herein on non-stacked transistor configurations will be plainly instructive of stacked configurations as well, given the bottom side contact formation generally does not impact a top portion of a stacked configuration.

Figure 3A:
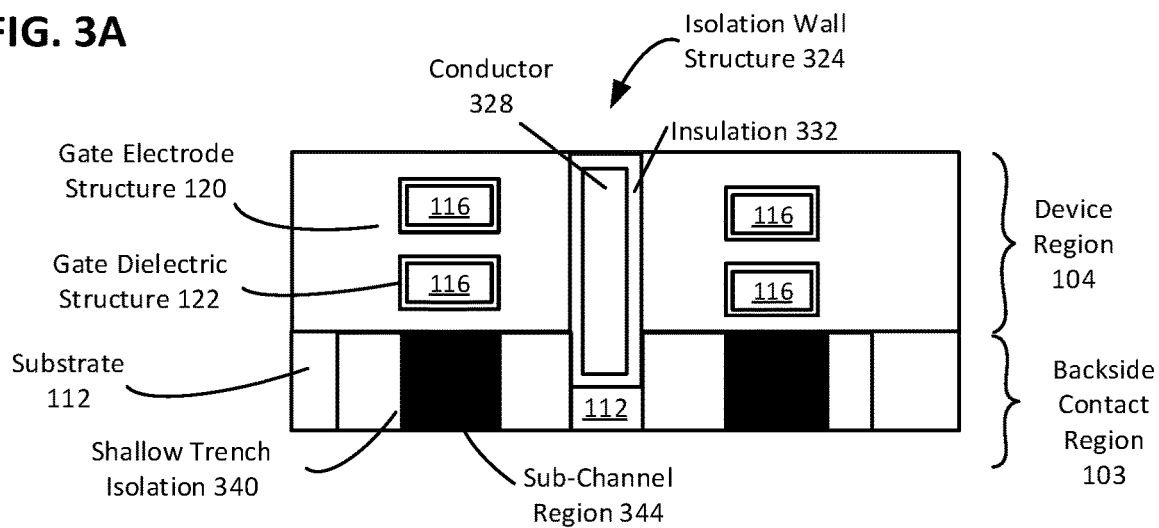

Turning to FIG. 3A, a cross-sectional view of a partially fabricated example integrated circuit structure is shown, according to an embodiment. The cross-section is taken perpendicular to the fin structures and through the gate structure, so as to show the channel regions. The device structure includes a device region 104, which may be the only device layer, or a lower device layer in a stacked configuration, as will be appreciated. The device structure includes, at this stage of fabrication, substrate 112, nanowires 116, gate dielectric structure 122, and gate electrode 120. The previous relevant discussion with respect to each of these features is equally applicable here. In addition, the integrated circuit structure further includes an isolation wall structure 324 separating the two fin structures shown, as well as shallow trench isolation (STI) 340 and sub-channel region 344.

Two fin structures are depicted, one on left and one on right. The fin structures have been processed to include nanowires 116 in the channel region. Furthermore, the isolation wall structure 324 is between the two fin structures. The isolation wall structure 324, if present, can be implemented with standard processing and have any number of standard or proprietary configurations. In some such example embodiments, for instance, the isolation wall structure 324 includes an conductor 328 (e.g., tungsten, copper, silver, aluminum, etc) that is encapsulated by one or more layers of insulation material 332 (e.g., silicon nitride, or a bi-layer structure including a first layer of silicon dioxide on conductor 328 and a second layer of silicon nitride on the first layer). The bottom portion of the isolation wall structure 324 is within the substrate 112 is at least partially surrounded by shallow trench isolation layer 340 (e.g., silicon dioxide). Numerous insulation materials and structures can be used for STI 340 and insulation 332, as will be appreciated.

The sub-channel (or sub-fin) regions 344 may vary in configuration, depending on the given application. In some cases, sub-channel regions 344 are part of the substrate 112, such as fin stubs just below the lowest nanowire 116 (e.g., silicon fin stubs extending upward from the substrate), while in other cases sub-channel regions 344 are an insulator region (e.g., silicon dioxide without or without a silicon nitride liner) disposed or otherwise formed within the substrate 112 and configured to reduce off-state current leakage. As will be discussed in turn, materials used for the sub-channel regions 344 can be removed by etches that do not remove (or remove at a significantly slower rate, e.g., by a factor of 2×, 3×, 5×, 10×, or more) etch selective material 356 and other materials exposed during removal of the removal of sub-channel regions 344, as will be described in turn.

Figure 3B:
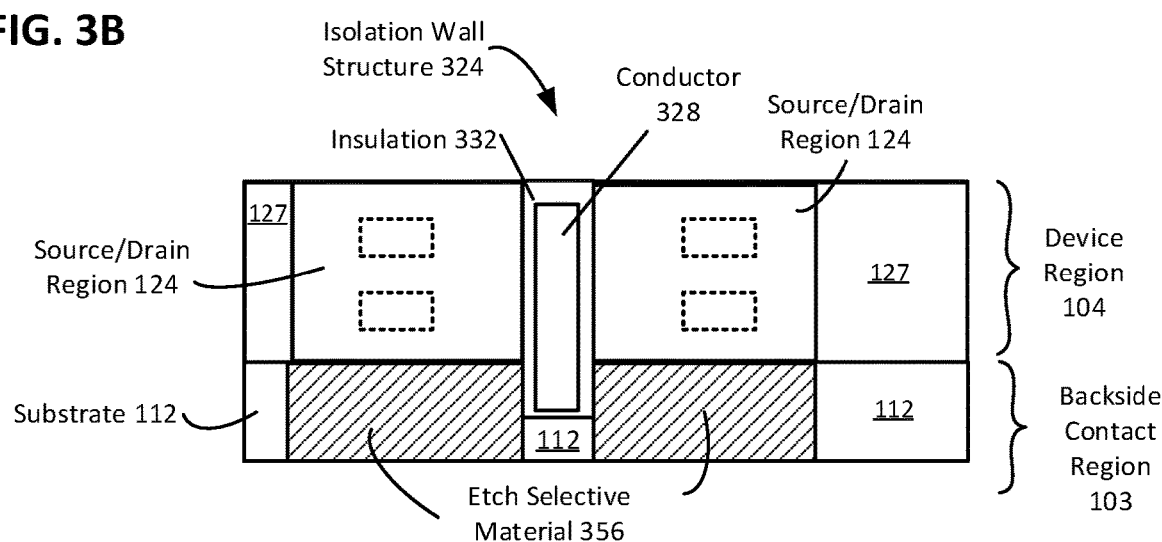

Turning to FIG. 3B, the cross-section depicted is taken perpendicular to the fin structures and through the source/drain regions. The source/drain regions 124 can be formed using standard techniques such as those previously described in the context of FIGS. 1A-B, such as an etch and replace process where epitaxial source/drain regions are provided. However, according to an embodiment of the present disclosure, the source/drain recess is etched so as to extend deeper down into the substrate so that etch selective material 356 can be deposited into that trench prior to deposition of the source/drain materials. Standard source/drain recess etching schemes can be used (e.g., wet and/or dry etch). The depth of the source/drain trench may be deeper than normally done, to accommodate the addition of the etch selective material 356. For instance, in this example case, the source/drain trench extends past the bottom of the isolation wall structure 324, but in other embodiments extends to the same depth as the isolation wall structure 324 or just above the depth as the isolation wall structure 324. In any such cases, and as will be appreciated in light of this disclosure, note that the backside of substrate 112 or structure can later be polished or otherwise planarized (during backside contact formation) to expose the backside of the etch selective material 356. Further note that while source/drain regions 124 are shown as having rectangular cross-sections, other cross-sectional shapes are possible, such as faceted top and/or bottom surfaces, as previously explained. Nanowires 116 are shown with a dashed line to indicate their laterally adjacent location that is obscured by the source/drain regions 124 from this perspective.

Note that, even though not shown, frontside contacts can be formed on source/drain regions 124, if so desired, even if backside contacts are going to be provisioned as well. In such a case, front side contact formation may include, for instance, a deposition of a dielectric layer over the source/drain regions 124, followed by formation of contact trench and deposition of contact materials into those trenches. Such frontside contacts may be used to facilitate desired frontside connections or simply left unconnected. In some embodiments, the front side contacts may be connected to further metal and dielectric layers which are deposited above the source/drain regions 124, in the form of one or more interconnect layers (sometimes called metallization layers or BEOL). Such frontside contacts and interconnect/metallization layer can be provisioned first, then the resulting structure can be flipped over so that backside contact processing can be carried out. In such cases, note that prior to the flipping, the frontside can be passivated or otherwise protected (e.g., bonded to a temporary substrate by way of a bonding oxide that can later be removed).

A number of etch selective materials can be used. In general, oxides and nitrides tend to be etch selective with respect to each other (e.g., a first etchant that etches the nitride won't etch an oxide, and a second etchant that etches the oxide won't etch the nitride). In some examples, the etch selective material 356 can be composed of titanium nitride (TiN), although other materials that provide the desired etch selectivity can be used, as will be appreciated in light of this disclosure. Example etchants that can be used to remove the etch selective material 356 (TiN) include, but are not limited to a mixture of hot (e.g., 40° C. or more) sulfuric acid ($H_2SO_4$) and peroxide ($H_2O_2$). More generally, it will be appreciated that the etch selective material 356 can be composed so as to be removable by a corresponding etch that will not remove differently composed etch selective materials that are described below in more detail. Any excess material 356 can be polished or otherwise planarized down to the surface of substrate 112 using chemical mechanical polish (CMP).

Figure 3C:
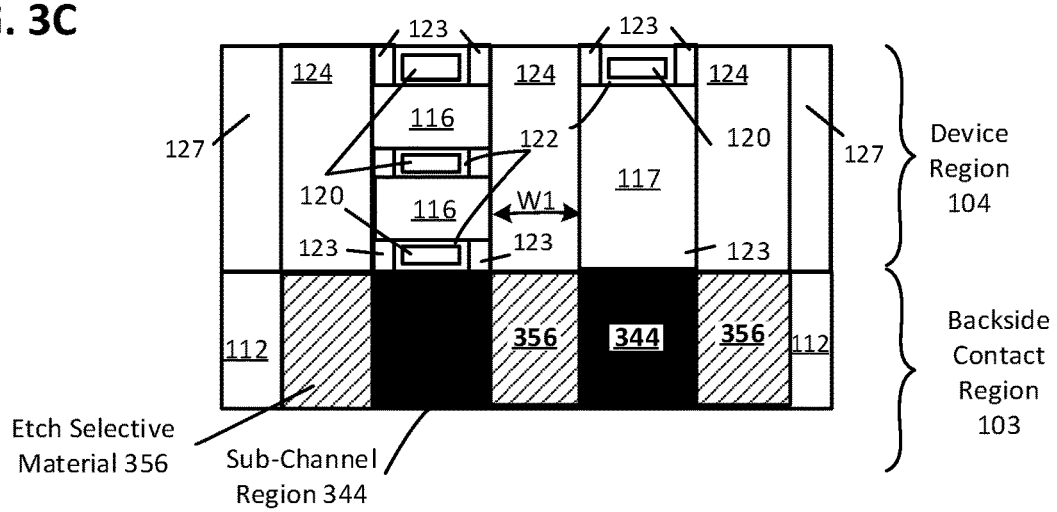

FIG. 3C illustrates another cross-sectional view of the example structure shown in FIGS. 3A-B. The cross-section is taken perpendicular to a gate structures and through the channel regions of one of the fin structures (rotated 90 degrees from the view shown in FIGS. 3A-B). As shown in this particular example embodiment, etch selective material 356 is within the substrate 112 and below the source/drain regions 124. Note that the etch selective material 356 is effectively self-aligned to the sub-channel region 344 below the nanowires 315 making up the channel region. This is because the etch selective material 356 is provisioned in the extended source/drain trenches that are etched down adjacent the channel region (and sub-channel region 344) during the source/drain formation process.

Figure 4A:
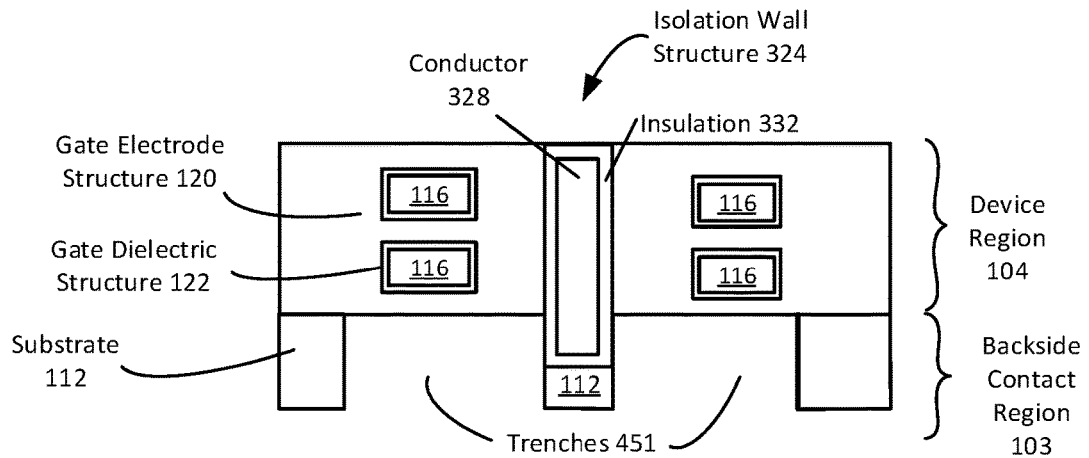
Figure 4B:
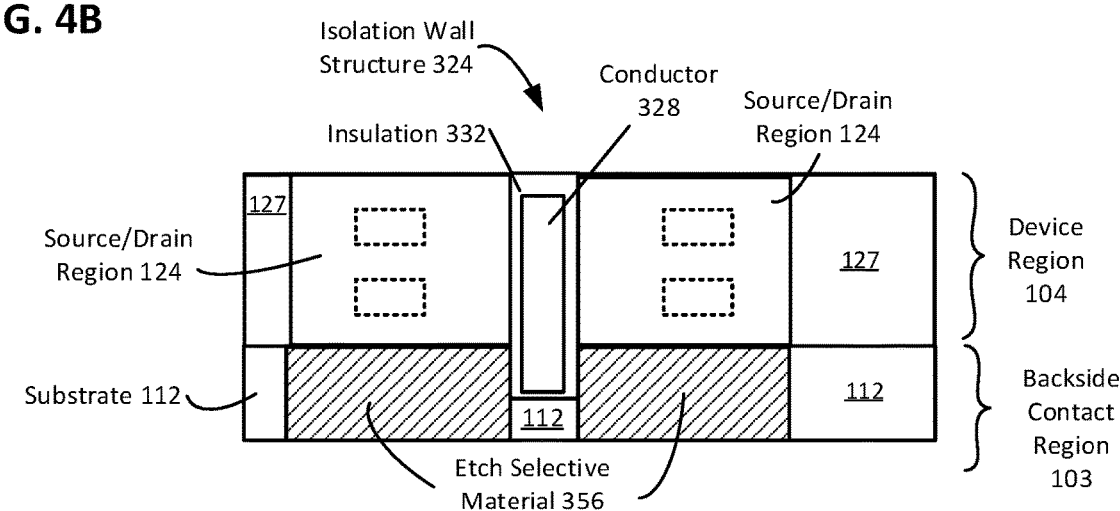
Figure 4C:
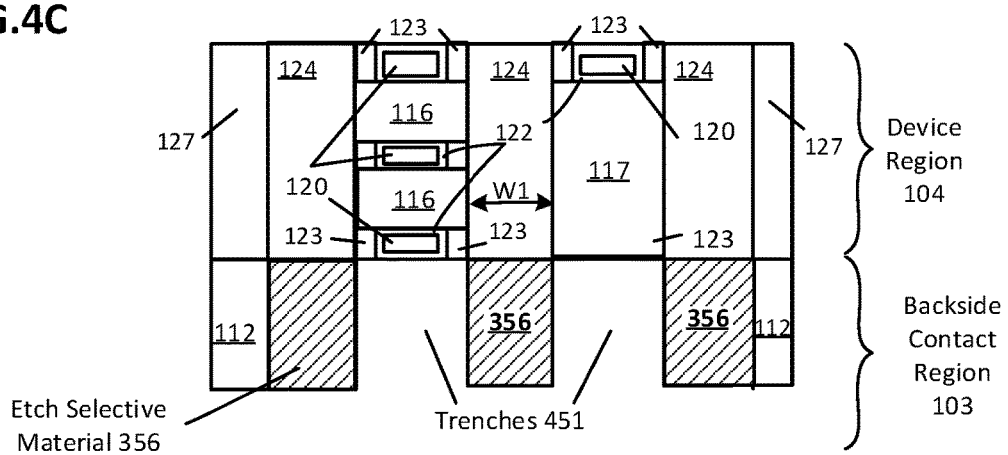

Turning now to FIG. 4A, processing may continue with removal of sub-channel region 344 (e.g., silicon or $SiO_x$) and any associated liners (e.g., silicon nitride), thus forming cavities or trenches 451 formerly occupied by these elements. The cross-section depicted is taken perpendicular to the fin structures and through the channel regions. In this case, the formed cavities are in the substrate 112 below the gate structures and between neighboring portions or blocks of etch selective material 356. Thus, the etchant used to remove the sub-channel region 344 can be selective to the etch selective material 356 (i.e., removes the material of sub-channel region 344 but not the etch selective material 356). In some example cases, etches that can be used to remove silicon oxide-based sub-channel region 344 materials include, for instance, $CF_4/CH_2F_2$ plasma or $C_4F_6$/Argon (Ar) plasma. Etches to remove silicon nitride-based structures (e.g., sub-channel region 344 liner), if present, include, for example, $CH_3F/He/O_2$ plasma. FIG. 4B depicts the cross-section taken perpendicular to the fin structures and through the source/drain regions, and shows that the use of a selective etch to remove sub-channel region 344 largely leaves the etch selective material 356 (in this example, composed of TiN) in place below the source/drain regions 124. FIG. 4C illustrates the integrated circuit structure of FIGS. 4A-B, but rotated 90 degrees, with the cross-section depicted taken perpendicular to the gate structures and through the channel regions.

Figure 5A:
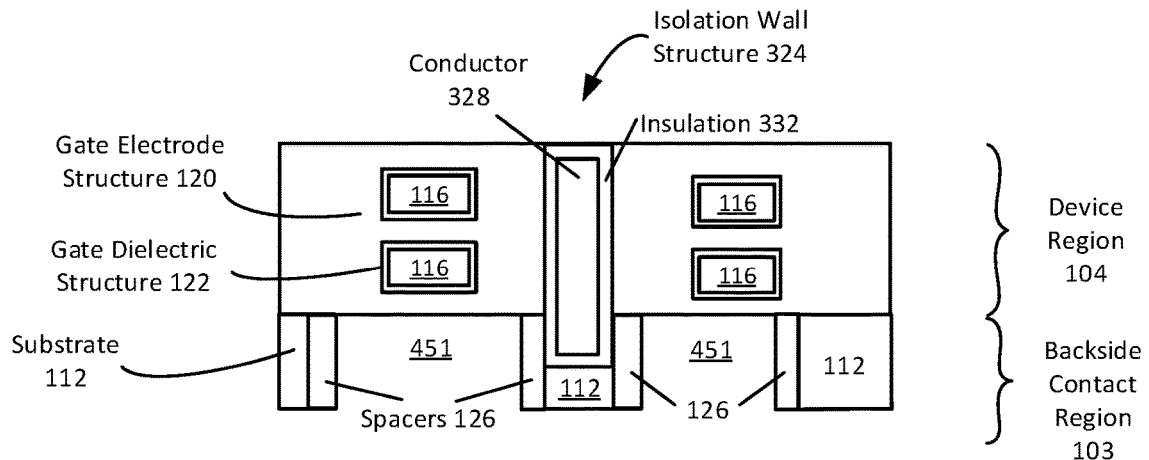
Figure 5B:
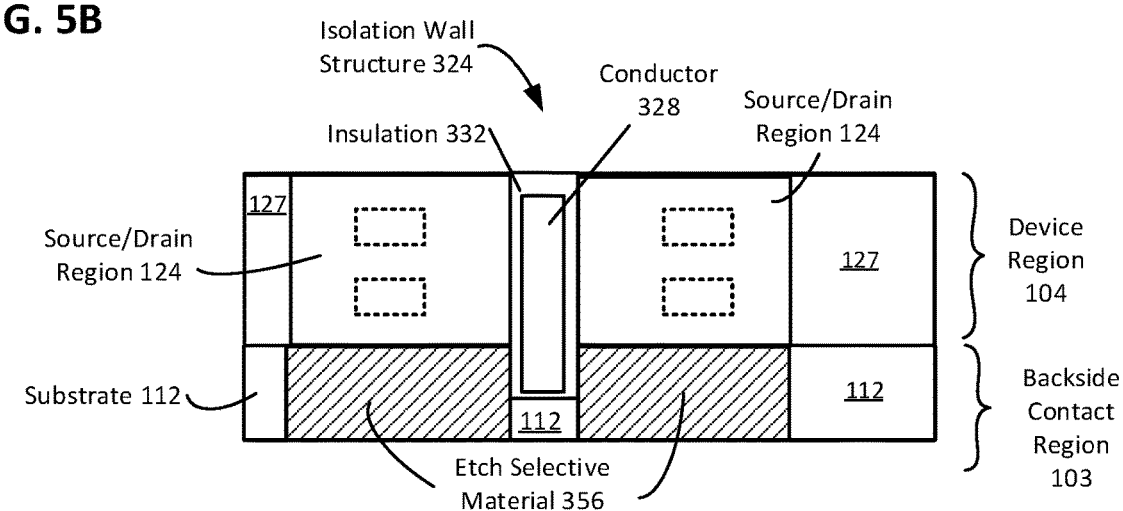
Figure 5C:
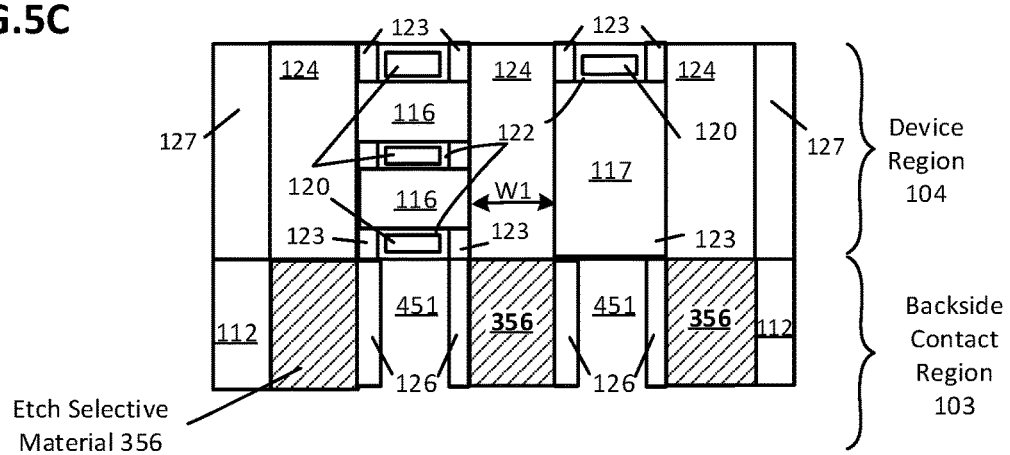

As illustrated in FIG. 5A, processing continues with formation of a conformal dielectric spacer 126 on the sidewalls of trenches 451. The cross-section depicted is taken perpendicular to the fin structures and through the channel regions. As will be appreciated in light of the present disclosure, the dielectric spacer 126 can provide electrical insulation between adjacent conductive structures. In some examples, the conformal dielectric spacer 126 can be formed from materials also used for gate spacers 123A-B. Example materials include, for instance, carbon doped silicon oxynitride as well as other silicon based dielectric materials (e.g., SiN, $SiO_x$). These materials can be formed from any conformal deposition process, including but not limited to atomic layer deposition (ALD), chemical vapor deposition (CVD), among others. A directional etch (e.g., a anisotropic dry plasma etch) can be used to remove conformally deposited spacer 126 formed on the various exposed horizontal surfaces (e.g., bottom of gate electrodes 120), while leaving the vertical sidewall spacers 126, as shown. The cross-section depicted in FIG. 5B is taken perpendicular to the fin structures and through the source/drain regions, and illustrates that the formation of spacers 126 leaves the etch selective material 356 (in this example, composed of TiN) in place below the source/drain regions 124. FIG. 5C illustrates the integrated circuit structure of FIGS. 5A-B, but rotated 90 degrees, with the cross-section depicted taken perpendicular to the gate structures and through the channel regions.

Figure 6A:
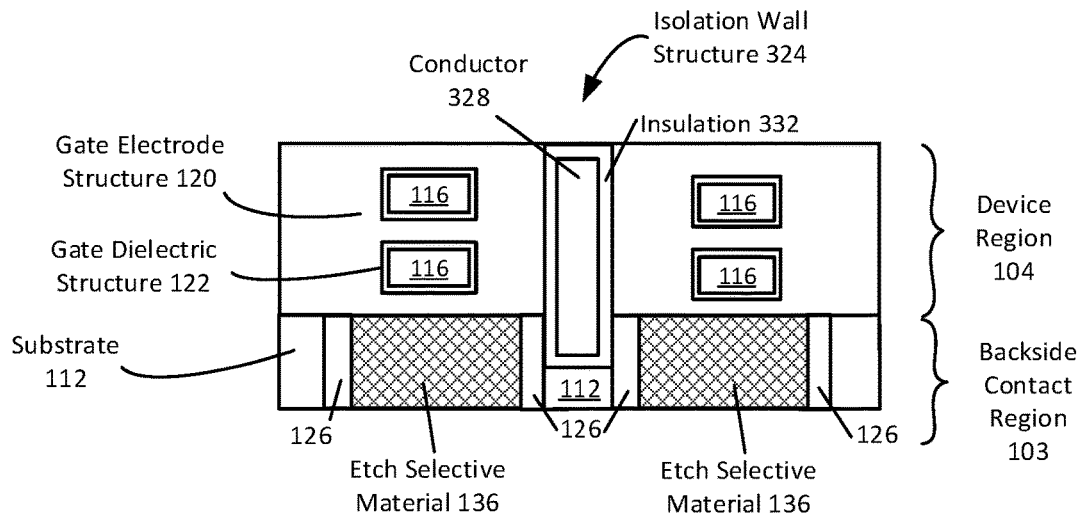
Figure 6B:
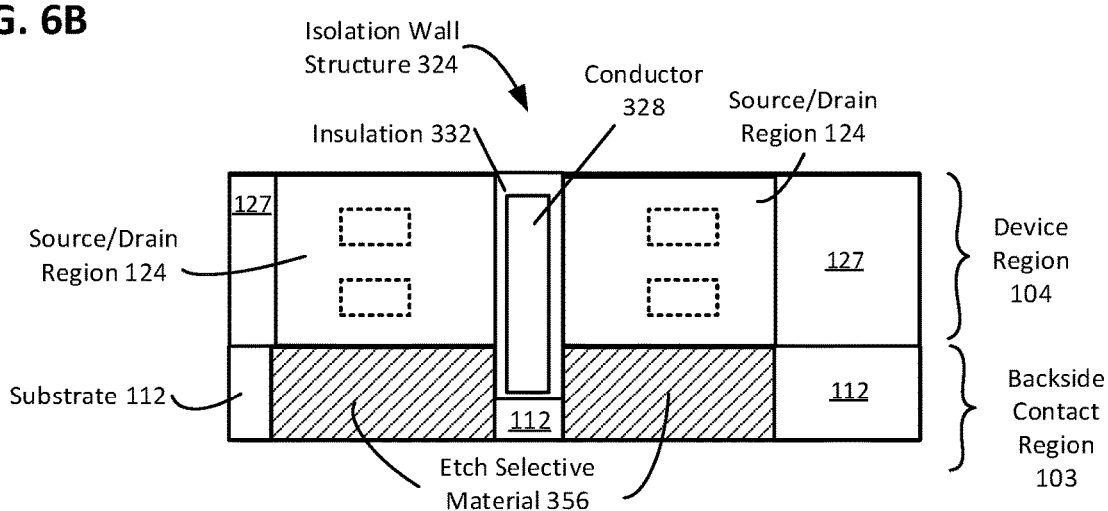
Figure 6C:
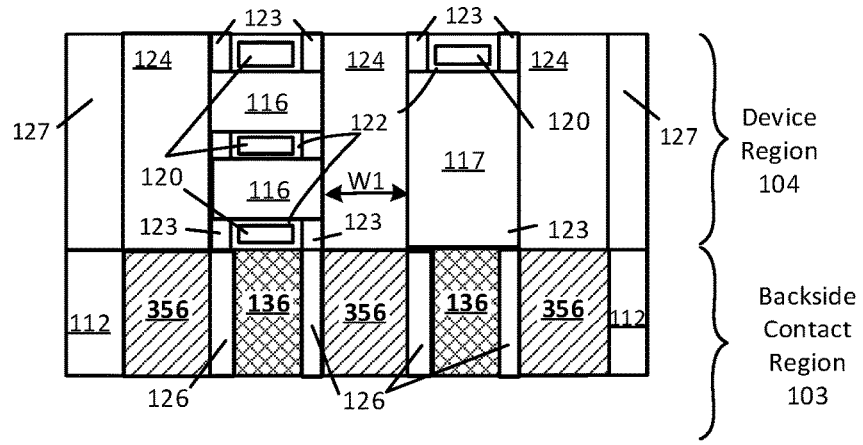
Figure 6D:
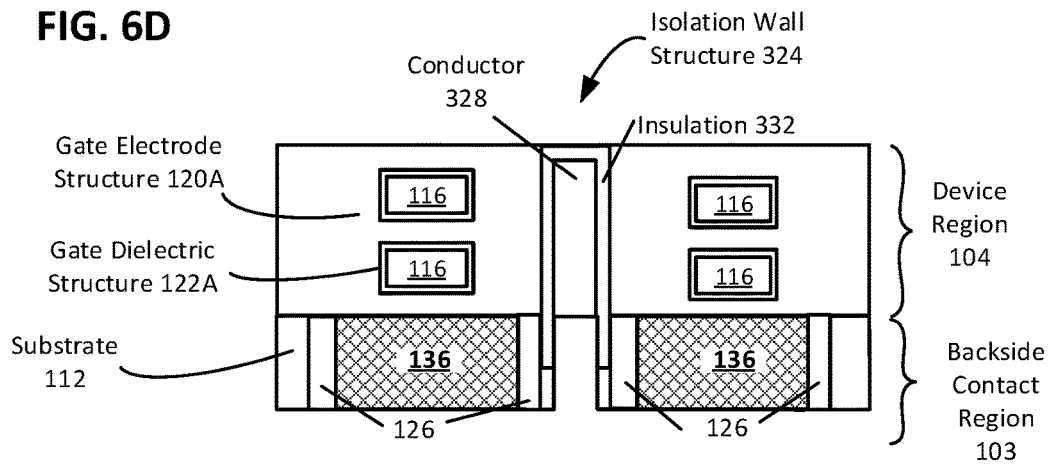

FIG. 6A shows the resulting structure after the spacerized trenches 451 are filled with a etch selective material 136. The cross-section depicted is taken perpendicular to the fin structures and through the channel regions. As previously explained, the etch selective material 136 can be selectively etched with respect to etch selective material 356, and vice-versa. In some specific examples, the etch selective material 356 is titanium nitride and the etch selective material 136 is a dielectric material such as $SiO_x$, silicon nitride, silicon carbide, metal oxides, and silicon oxynitride. Example etches for the etch selective material 136 include, for instance, $CF_4/CH_2F_2$ plasma or $C_4F_6$/Argon plasma for silicon oxide-based materials, and $CH_3F/He/O_2$ plasma for silicon nitride-based materials. Note that any excess etch selective material 136 can be planarized down to the bottom surface of structure (e.g., so as to be coplanar with surface of etch selective material 356). Any suitable deposition techniques can be used (e.g., ALD and/or plasma assisted CVD). The cross-section depicted in FIG. 6B is taken perpendicular to the fin structures and through the source/drain regions, and illustrates that the formation of etch selective material 136 leaves the etch selective material 356 (in this example, composed of TiN) in place below the source/drain regions 124. FIG. 6C illustrates the integrated circuit structure of FIGS. 6A-B, but rotated 90 degrees, with the cross-section depicted taken perpendicular to the gate structures and through the channel regions.

Figure 6E:
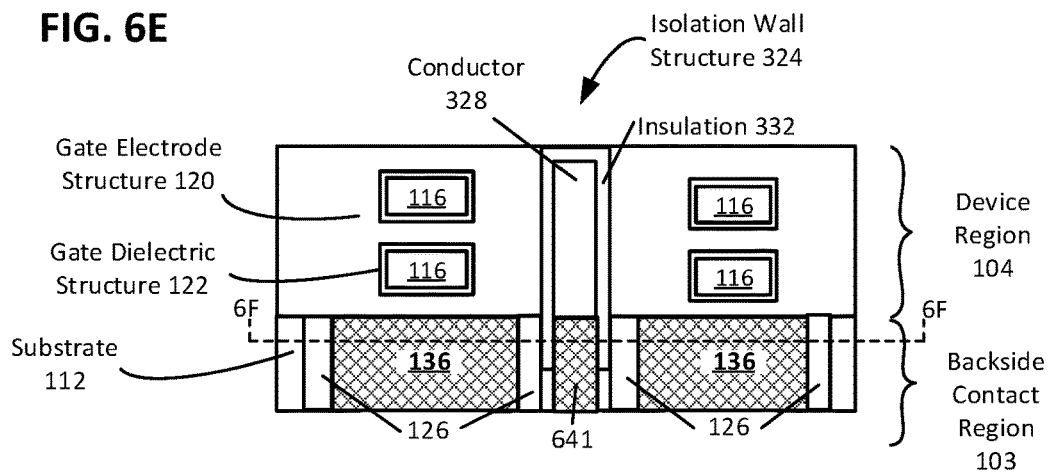
Figure 6F:
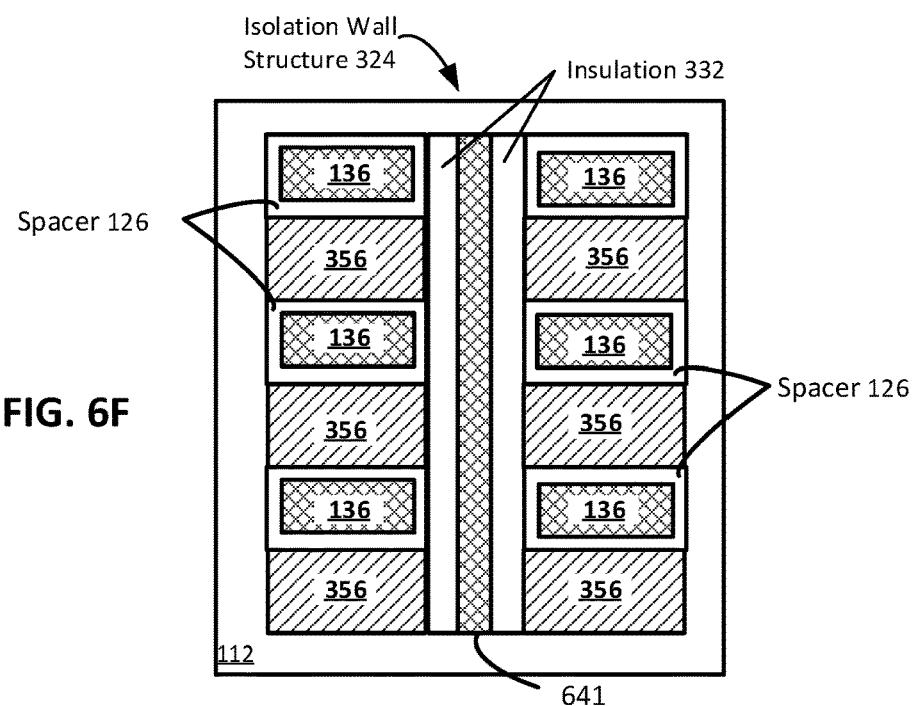

FIGS. 6E and 6F illustrate two views of an optional process in which backside contacts can be formed with a buried conductor in an isolation wall structure, according to still other embodiments. Turning first to FIG. 6E, an isolation wall structure 324 is shown running between and parallel to the fin structures (and nanowires 116). As will be noted, the cross-section depicted is taken perpendicular to the fin structures and through the channel regions. In this example case, the backside of the substrate 112 can be patterned and etched so as to expose the conductor 328 buried within the insulation 332 (e.g., in a similar process that is used to form trenches 451). The resulting trench formed can then be filled with etch selective material 641, which may be for example that same as etch selective material 136. As will be appreciated in light of the following description, the etch selective material 641 can be subsequently processed using the same techniques for processing other backside regions that include the etch selective material 136 (or 641) so as to form electrical contact between the buried conductor 612 and an interconnect (such as shown in FIG. 9B). FIG. 6F depicts a horizontal cross-section taken along the axis designated with a dashed line 6F-6F in FIG. 6E, according to some such embodiments. The various etch selective materials facilitate a subsequent backside contact formation process. Variations will be apparent.

Figure 7A:
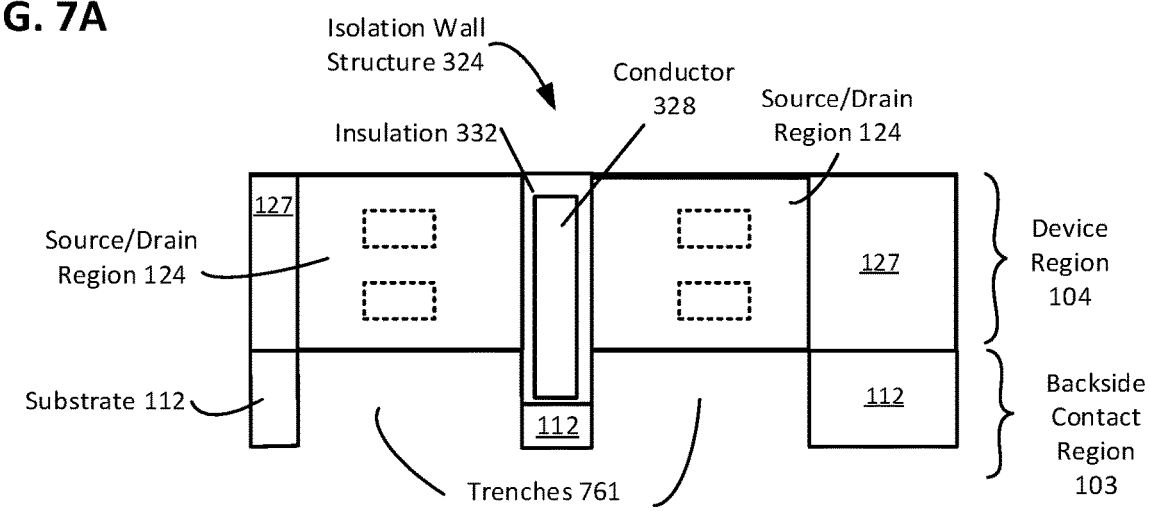
Figure 7B:
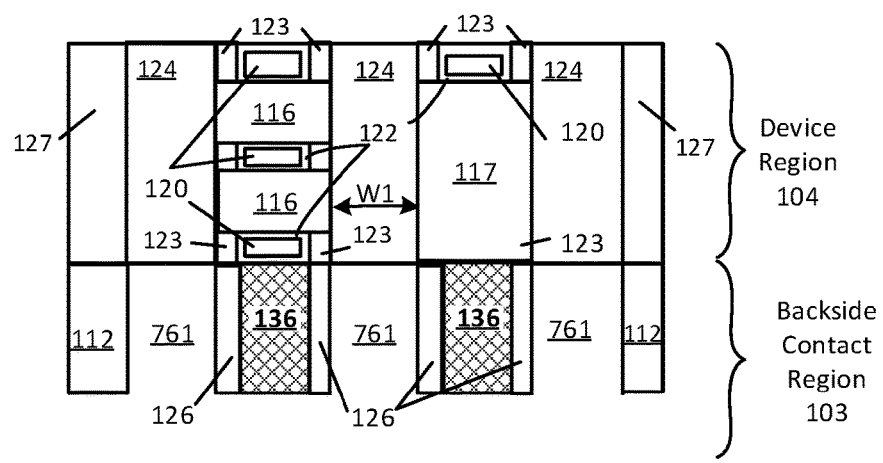

Turning now to FIG. 7A and FIG. 7B, the etch selective material 356 is removed using, for example, one of previously described etch chemistries, thus forming trenches 761 and exposing the bottom surface of the source/drain regions 124. Recall that the bottom surface may be faceted, but need not be in all embodiments. As will be appreciated, the cross-section depicted in FIG. 7A is taken perpendicular to the fin structures and through the source/drain regions 124. As will be further appreciated, removal of the etch selective material 356 using a corresponding etch chemistry will leave the etch selective material 136 as well as spacers 126 largely intact, as further shown in FIG. 7B, which illustrates the integrated circuit structure of FIG. 7A, but rotated 90 degrees, with the cross-section depicted taken perpendicular to the gate structures and through the channel regions.

Continuing with reference to FIGS. 8A-B (having the same cross-sections as FIGS. 7A-B, respectively), a source/drain contact can then be formed in the trenches 761 on the bottom surface of the source/drain regions 124. For instance, a conformal S/D contact layer 138 is deposited into trenches 761, and any excess deposition can be etched back. Examples of the conformal S/D contact layer 138 include, but are not limited to tungsten, titanium, cobalt, gold, aluminum, silver, copper, among others. Conformal deposition of the contact layer 138 can be accomplished using any number of techniques, including but not limited to ALD, CVD, plasma assisted CVD, among others. As previously explained, the S/D regions 124 need not have rectangular cross-sections and may be faceted, such those examples illustrated in FIG. 8A-1. In such cases the source/drain contact layer 138 conforms to the profile of the exposed surface of the source/drain region 124. Example of one such embodiment is further illustrated in FIG. 8A-2. In some cases, the contact layer 138 may be a multiple component structure. For instance, a silicide and/or germanide layer (shown as layer 863 in FIG. 8A-2) can form between the conformal S/D metal layer 862 and corresponding the source/drain region 124. Any number of layers at the metal/semiconductor interface will be appreciated, depending on the compositions of the source/drain region 124 and contact 138. For instance, in one specific example case, if a dominant component of the source/drain region 124 is silicon and the contact layer 138 comprises titanium, then layer 863 may comprise titanium silicide.

After the conformal S/D contact layer 138 is formed, an etch selective material 140 is deposited to fill the remainder of trenches 761, as further shown in FIGS. 8A-8B. As will be appreciated, the etch selective material 140 is a dielectric material that can be resistant to the etch chemistries that can remove the etch selective material 136. In some cases, example materials for the etch selective material 140 include, but are not limited to $SiO_x$, silicon nitride, silicon carbide, metal oxides, and silicon oxynitride. So, in one example embodiment, the etch selective material 136 is silicon oxide-based materials that are etched by $CF_4/CH_2F_2$ plasma or $C_4F_6$/Argon (Ar) plasma, and the etch selective material 140 is silicon nitride-based materials that are etched by $CH_3F/He/O_2$ plasma, and the spacers 126 are carbon doped oxynitride. Other variations will be apparent, given that nitrides, oxides, and carbides tend to be etch selective with respect to each other.

FIGS. 9A-D collectively illustrate the formation of interconnects 968A and 968B (e.g., vias and metal lines), thus forming backside contact region 103, according to an embodiment of the present disclosure. As will be appreciated, and as indicated above, because the etch selective material 136, 641, and etch selective material 140 are dielectric materials in this example embodiment, the interconnects 968A-B can have widths that would normally form an electrical short to an adjacent area, but do not due to the electrical insulation provided by the etch selective materials 136 and/or 140 and/or 641.

Figure 9A:
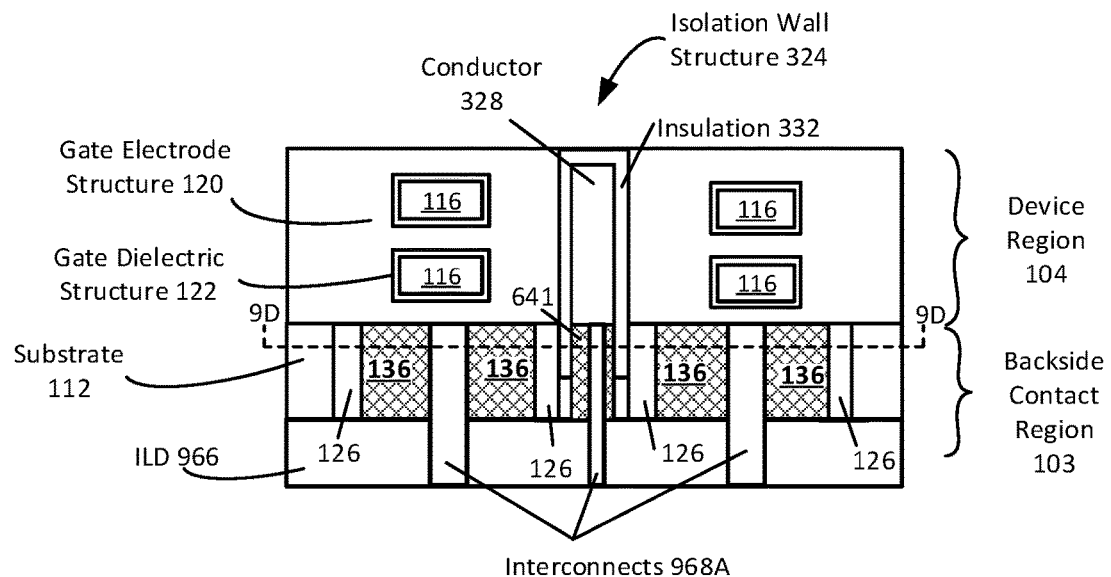
Figure 9B:
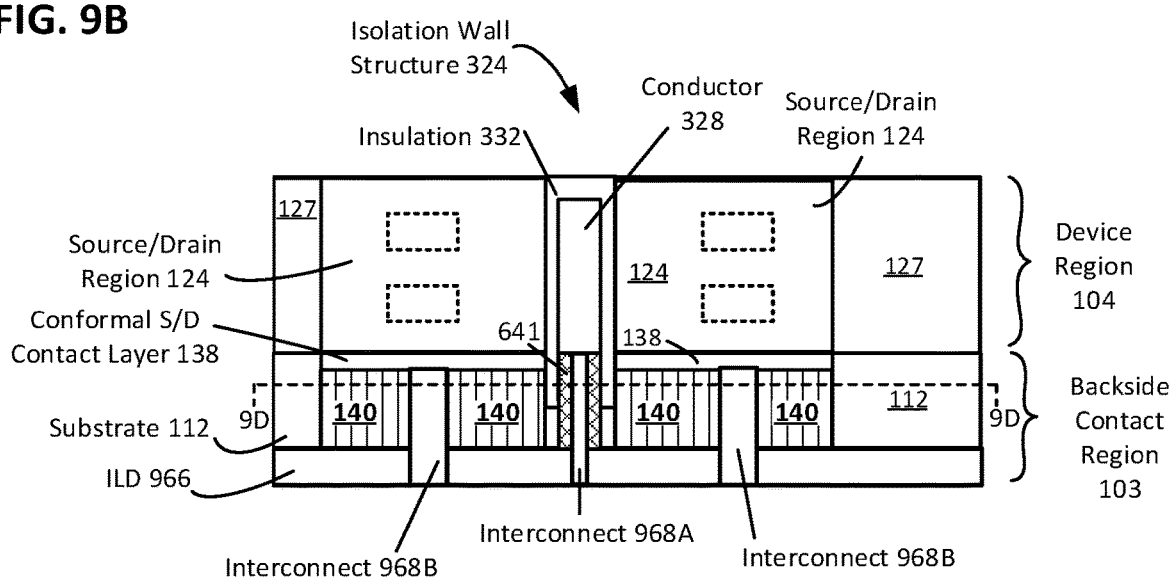

Turning first to FIG. 9A, an interlayer dielectric (ILD) layer 966 is formed on the backside of the structure and then patterned, according to one example embodiment. A first etch scheme that is selective to etch selective material 140 and spacers 126 (meaning that etch selective material 136 is etched at a much faster rate than etch selective material 140 and spacers 126) is used to form a first set of interconnect trenches. Interconnects 968A (e.g., vias) are then deposited into the resulting trenches using any suitable deposition technique (e.g., CVD, etc). As will be appreciated, the cross-section depicted in FIG. 9A is taken perpendicular to the fin structures and through the channel regions. In the example of FIG. 9A, backside interconnects 368A enable electrical communication with gate electrodes 120 in the device region 104 as well as the conductor 328 within the isolation wall structure 324. Note that, in this example cases, only a portion of each etch selective layer 136 is removed (such as by patterning on backside with lithography to expose that portion, rather than the entire area of etch selective layer 136). In such an example case, one advantage is that the lithography can be relatively loosely aligned and need not define individual features like would be required when using standard backside processes. So, as can be seen in this example case, the resultant structure includes some regions where an etch selective material 136 is replaced with metal (interconnect 968A), and some regions where the etch selective material 136 remains in final structure and no backside contact is formed in those regions.

Then turning to FIG. 9B, a second etch scheme that is selective to etch selective material 136 and spacers 126 (meaning that etch selective material 140 is etched at a much faster rate than etch selective material 136 and spacers 126) is used to form a second set of interconnect trenches. Interconnects 968B (e.g., vias) are then deposited into the resulting trenches using any suitable deposition technique (e.g., CVD, etc). As will be appreciated, the cross-section depicted in FIG. 9B is taken perpendicular to the fin structures and through the source/drain regions. In the example of FIG. 9B, backside interconnects 368B enable electrical communication with source/drain regions 124 in the device region 104. Again, note that the resultant structure includes some regions where an etch selective material 140 is replaced with metal (interconnect 968B), and some regions where the etch selective material 140 remains in final structure and no backside contact is formed in those regions.

Figure 9C:
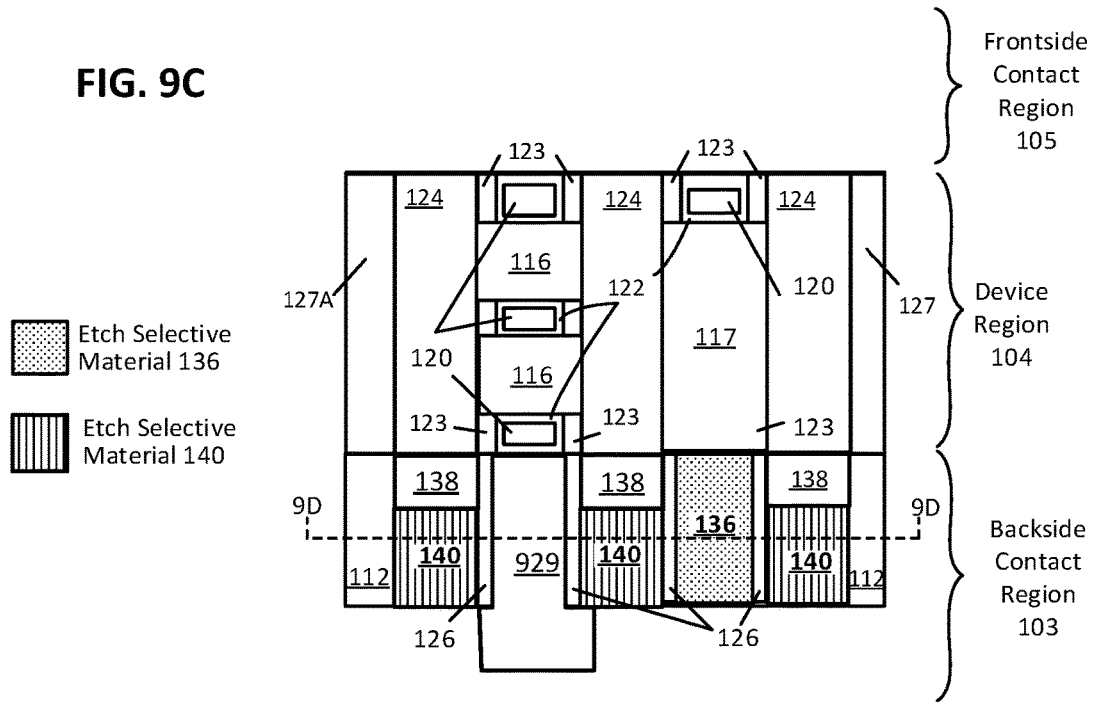
Figure 9D:
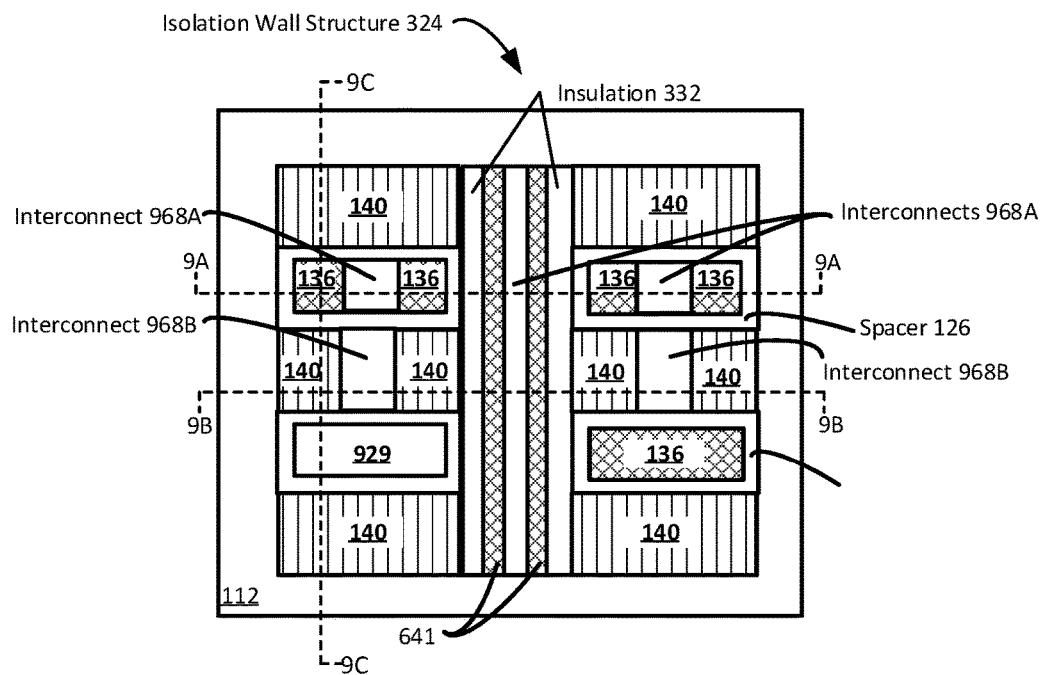

FIGS. 9C and 9D further illustrate the structures shown in FIGS. 9A-B. As will be noted, the cross-section depicted in FIG. 9C is taken perpendicular to the gate structures and through the channel regions, and FIG. 9D depicts a horizontal cross-section taken along the axis designated with a dashed line 9D-9D in each of FIGS. 9A-C, according to some such embodiments. As shown in FIG. 9C, interconnect 929 can have a width that is greater than the width of the corresponding feature to which it is connecting (in this example case, a gate electrode). In this example case, note that the entire width of etch selective material 136 shown in the depicted cross-section is replaced with metal (interconnect 969), rather than leaving any etch selective material 136 directly adjacent the metal. Further note how each of etch selective material 136, etch selective material 140, and spacers 126 all exist in the same horizontal plane, such as taken at the horizontal cross-section taken along the axis designated with the dashed line 9D-9D. The interconnect features 968A-B and 929 can be any suitable conductive material, such as copper, aluminum, silver, gold, tungsten, etc. They may further include liners or barrier layers, such as tantalum nitride, which can help prevent electromigration of the conductive material into the neighboring dielectric materials.

Example System

Figure 10:
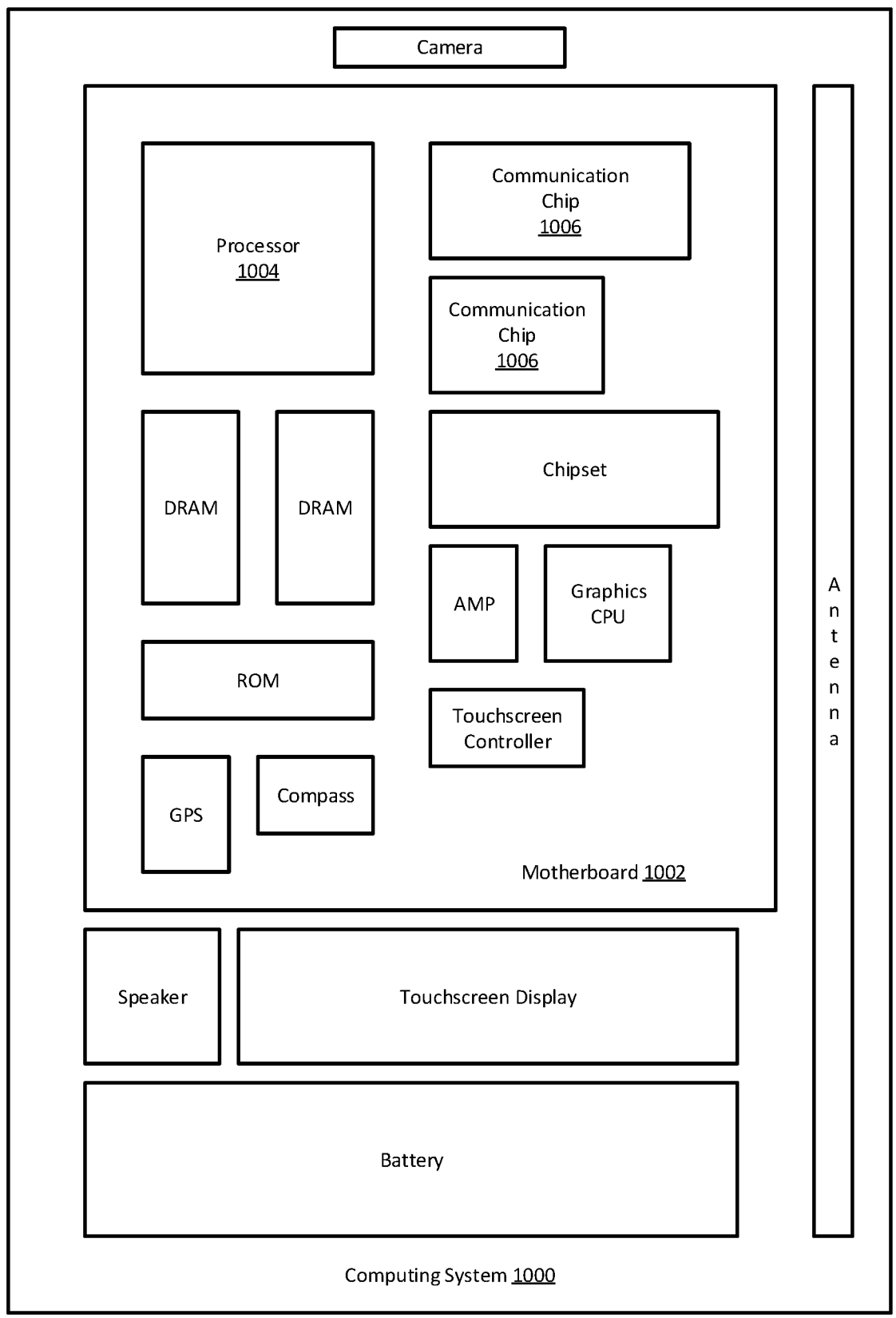
FIG. 10 illustrates a computing system implemented with one or more integrated circuit structures configured in accordance with an embodiment of the present disclosure The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

FIG. 10 is an example computing system implemented with one or more of the integrated circuit structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., a stacked or unstacked CMOS device that includes frontside and backside contacts, as well as one or more etch selective materials, as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include backside contacts as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices configured with backside contacts as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices configured with backside contacts as variously described herein.

As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit structure comprising: a device region comprising a transistor, the transistor including a source or drain region and a gate structure; a frontside contact region above the device region; and a backside contact region below the device region, the backside contact region including a first dielectric material under the source or drain region of the transistor, a second dielectric material laterally adjacent to the first dielectric material and under the gate structure of the transistor, and a non-conductive spacer laterally between the first and second dielectric materials, wherein the first and second dielectric materials are selectively etchable with respect to one another and the non-conductive spacer.

Example 2 includes the subject matter of Example 1, wherein the backside contact region further comprises an interconnect feature that passes through the first dielectric material and contacts a bottom side of the source or drain region.

Example 3 includes the subject matter of Example 2, and further includes a contact structure on a bottom side of the source region or drain region, the contact structure comprising a metal, wherein the interconnect feature directly contacts the contact structure.

Example 4 includes the subject matter of Example 3, wherein the contact structure is conformal to the bottom side of the source region or drain region.

Example 5 includes the subject matter of any of the preceding Examples, wherein the backside contact region further comprises an interconnect feature that passes through the second dielectric material and contacts the gate structure.

Example 6 includes the subject matter of Example 5, wherein the gate structure comprises a high-k dielectric and a gate electrode, and the interconnect feature is in contact with the gate electrode.

Example 7 includes the subject matter of any of the preceding Examples, wherein the device region further comprises an isolation wall structure, the isolation wall structure including an insulation material and a conductor within the insulation material.

Example 8 includes the subject matter of Example 7, wherein one of the first or second dielectric materials is also under the isolation wall structure.

Example 9 includes the subject matter of Example 8, wherein the backside contact region further comprises an interconnect feature that passes through the first or second dielectric material under the isolation wall structure and contacts the conductor.

Example 10 includes the subject matter of any of the preceding Examples, wherein the first dielectric material comprises a nitride, the second dielectric material comprises an oxide, and the non-conductive spacer comprises an oxynitride.

Example 11 includes the subject matter of any of the preceding Examples, wherein the transistor further comprises one or more nanowires or nanoribbons or nanosheets, and the gate structure wraps around those one or more nanowires or nanoribbons or nanosheets.

Example 12 includes the subject matter of any of the preceding Examples, wherein the transistor further comprises a fin structure, and the gate structure is on top and side walls of the fin structure.

Example 13 includes the subject matter of any of the preceding Examples, wherein the transistor is a first transistor, the device region further including a second transistor, and the first and second transistors are arranged in a stacked configuration with respect to one another, such that the first transistor is a bottom transistor and the second transistor is above the first transistor.

Example 14 includes the subject matter of Example 13, wherein the second transistor is directly connected to the frontside contact region.

Example 15 includes the subject matter of any of the preceding Examples, wherein the transistor is a first transistor, and the conductive spacer is a first conductive spacer that is laterally between first portions of the first and second dielectrics, the device region further including a second transistor that includes a source or drain region and a gate structure, wherein a second portion of the first dielectric material is under the source or drain region of the second transistor, and a second portion of the second dielectric material is laterally adjacent to the second portion of the first dielectric material and under the gate structure of the second transistor, and a second non-conductive spacer is laterally between the second portions of the first and second dielectric materials.

Example 16 is a printed circuit board comprising the integrated circuit structure of any of the preceding Examples.

Example 17 is an electronic system comprising the integrated circuit of any of Examples 1 through 15, or the printed circuit board of Example 16.

Example 18 is an integrated circuit structure comprising: a device region comprising a first transistor and a second transistor, each of the first and second transistors including a source or drain region and a gate structure; a frontside contact region above the device region; and a backside contact region below the device region, the backside contact region including a first dielectric material under the source or drain region of both the first and second transistors, a second dielectric material under the gate structure of both the first and second transistors, and a non-conductive spacer laterally between the first and second dielectric materials, wherein each of the first dielectric material, the second dielectric material, and the non-conductive spacer exist in the same horizontal plane, a first interconnect feature that passes through the first dielectric material and contacts a bottom side of the source or drain region of the first transistor, and a second interconnect feature that passes through the second dielectric material and contacts the gate structure of the second transistor.

Example 19 includes the subject matter of Example 18, and further includes a contact structure on a bottom side of the source region or drain region of the first transistor, the contact structure comprising a metal, wherein the first interconnect feature directly contacts the contact structure.

Example 20 includes the subject matter of Example 19, wherein the contact structure is conformal to the bottom side of the source region or drain region of the first transistor.

Example 21 includes the subject matter of any of Examples 18 through 20, wherein the gate structure of the second transistor comprises a high-k dielectric and a gate electrode, and the second interconnect feature is in contact with the gate electrode.

Example 22 includes the subject matter of any of Examples 18 through 21, wherein the device region further comprises an isolation wall structure, the isolation wall structure including an insulation material and a conductor within the insulation material.

Example 23 includes the subject matter of Example 22, wherein one of the first or second dielectric materials is also under the isolation wall structure.

Example 24 includes the subject matter of Example 23, wherein the backside contact region further comprises a third interconnect feature that passes through the first or second dielectric material under the isolation wall structure and contacts the conductor.

Example 25 includes the subject matter of any of Examples 18 through 24, wherein the first dielectric material comprises a nitride, the second dielectric material comprises an oxide, and the non-conductive spacer comprises an oxynitride.

Example 26 includes the subject matter of any of Examples 18 through 25, wherein one or both of the first and second transistors further comprise one or more nanowires or nanoribbons or nanosheets, and the corresponding gate structure wraps around those one or more nanowires or nanoribbons or nanosheets.

Example 27 includes the subject matter of any of Examples 18 through 26, wherein one or both of the first and second transistors further comprise a fin structure, and the corresponding gate structure is on top and side walls of the fin structure.

Example 28 includes the subject matter of any of Examples 18 through 27, wherein the device region includes a lower device region and an upper device region, and the first and second transistors are part of the lower device region.

Example 29 is a printed circuit board comprising the integrated circuit structure of any of Examples 18 through 28.

Example 30 is an electronic system comprising the integrated circuit of any of Examples 18 through 28, or the printed circuit board of Example 29.

Example 31 is an integrated circuit structure comprising: a device region comprising a first transistor, a second transistor, and a third transistor, each of the first, second, and third transistors including a source or drain region and a gate structure; a frontside contact region above the device region, the frontside contact region including a frontside interconnect feature connected directly to at least one of the source or drain region or the gate structure of the third transistor; and a backside contact region below the device region, the backside contact region including a first dielectric material under the source or drain region of both the first and second transistors, a second dielectric material under the gate structure of both the first and second transistors, and a non-conductive spacer laterally between the first and second dielectric materials, wherein one of the first dielectric material, the second dielectric material, and the non-conductive spacer is a nitride, one of the first dielectric material, the second dielectric material, and the non-conductive spacer is an oxide, and one of the first dielectric material, the second dielectric material, and the non-conductive spacer is an oxynitride, such that the first and second dielectric materials are selectively etchable with respect to one another and the non-conductive spacer.

Example 32 includes the subject matter of Example 31, and further includes a first bottom side interconnect feature that passes through the first dielectric material and contacts a bottom side of the source or drain region of the first transistor; and/or a second bottom side interconnect feature that passes through the second dielectric material and contacts the gate structure of the second transistor.

Example 33 includes the subject matter of Example 32, and further includes a contact structure on a bottom side of the source region or drain region of the first transistor, the contact structure comprising a metal, wherein the first bottom side interconnect feature directly contacts the contact structure, wherein the contact structure is conformal to the bottom side of the source region or drain region of the first transistor.

Example 34 includes the subject matter of Example 32 or 33, and further includes, wherein the gate structure of the second transistor comprises a high-k dielectric and a gate electrode, and the second bottom side interconnect feature is in contact with the gate electrode.

Example 35 includes the subject matter of any of Examples 31 through 34, wherein the device region further comprises an isolation wall structure, the isolation wall structure including an insulation material and a conductor within the insulation material.

Example 36 includes the subject matter of Example 35, wherein one of the first or second dielectric materials is also under the isolation wall structure.

Example 37 includes the subject matter of Example 36, wherein the backside contact region further comprises a third bottom side interconnect feature that passes through the first or second dielectric material under the isolation wall structure and contacts the conductor.

Example 38 includes the subject matter of any of Examples 31 through 37, wherein the first dielectric material comprises a nitride, the second dielectric material comprises an oxide, and the non-conductive spacer comprises an oxynitride.

Example 39 includes the subject matter of any of Examples 31 through 38, wherein one or both of the first and second transistors further comprise one or more nanowires or nanoribbons or nanosheets, and the corresponding gate structure wraps around those one or more nanowires or nanoribbons or nanosheets.

Example 40 includes the subject matter of any of Examples 31 through 39, wherein one or both of the first and second transistors further comprise a fin structure, and the corresponding gate structure is on top and side walls of the fin structure.

Example 41 includes the subject matter of any of Examples 31 through 40, wherein the device region includes a lower device region and an upper device region, and the first and second transistors are part of the lower device region.

Example 42 is a printed circuit board comprising the integrated circuit structure of any of Examples 31 through 41.

Example 43 is an electronic system comprising the integrated circuit of any of Examples 31 through 41 or the printed circuit board of Example 42.

What is claimed is:

1. An integrated circuit structure comprising:
   a device region comprising a transistor, the transistor including a source or drain region and a gate structure;
   a frontside contact region above the device region; and
   a backside contact region below the device region, the backside contact region including a first dielectric material under the source or drain region of the transistor, a second dielectric material laterally adjacent to the first dielectric material and under the gate structure of the transistor, and a non-conductive spacer laterally between the first and second dielectric materials, wherein the first and second dielectric materials are selectively etchable with respect to one another and the non-conductive spacer.

2. The integrated circuit structure of claim 1, wherein the backside contact region further comprises an interconnect feature that passes through the first dielectric material and contacts a bottom side of the source or drain region.

3. The integrated circuit structure of claim 2, further comprising a contact structure on a bottom side of the source region or drain region, the contact structure comprising a metal, wherein the interconnect feature directly contacts the contact structure, wherein the contact structure is conformal to the bottom side of the source region or drain region.

4. The integrated circuit structure of claim 1, wherein the backside contact region further comprises an interconnect feature that passes through the second dielectric material and contacts the gate structure, and wherein the gate structure comprises a high-k dielectric and a gate electrode, and the interconnect feature is in contact with the gate electrode.

5. The integrated circuit structure of claim 1, wherein the device region further comprises an isolation wall structure, the isolation wall structure including an insulation material and a conductor within the insulation material.

6. The integrated circuit structure of claim 5, wherein one of the first or second dielectric materials is also under the isolation wall structure, and wherein the backside contact region further comprises an interconnect feature that passes through the first or second dielectric material under the isolation wall structure and contacts the conductor.

7. The integrated circuit structure of claim 1, wherein the first dielectric material comprises a nitride, the second dielectric material comprises an oxide, and the non-conductive spacer comprises an oxynitride.

8. The integrated circuit structure of claim 1, wherein the transistor further comprises one or more nanowires or nanoribbons or nanosheets, and the gate structure wraps around those one or more nanowires or nanoribbons or nanosheets.

9. The integrated circuit structure of claim 1, wherein the transistor further comprises a fin structure, and the gate structure is on top and side walls of the fin structure.

10. The integrated circuit structure of claim 1, wherein the transistor is a first transistor, the device region further including a second transistor, and the first and second transistors are arranged in a stacked configuration with respect to one another, such that the first transistor is a bottom transistor and the second transistor is above the first transistor, and wherein the second transistor is directly connected to the frontside contact region.

11. The integrated circuit structure of claim 1, wherein the transistor is a first transistor, and the non-conductive spacer is a first non-conductive spacer that is laterally between first portions of the first and second dielectric materials, the device region further including a second transistor that includes a source or drain region and a gate structure, wherein a second portion of the first dielectric material is under the source or drain region of the second transistor, and a second portion of the second dielectric material is laterally adjacent to the second portion of the first dielectric material and under the gate structure of the second transistor, and a second non-conductive spacer is laterally between the second portions of the first and second dielectric materials.

12. An integrated circuit structure comprising:
    a device region comprising a first transistor and a second transistor, each of the first and second transistors including a source or drain region and a gate structure;
    a frontside contact region above the device region; and
    a backside contact region below the device region, the backside contact region including
      a first dielectric material under the source or drain region of both the first and second transistors, a second dielectric material under the gate structure of both the first and second transistors, and a non-conductive spacer laterally between the first and second dielectric materials, wherein each of the first dielectric material, the second dielectric material, and the non-conductive spacer exist in the same horizontal plane,
      a first interconnect feature that passes through the first dielectric material and contacts a bottom side of the source or drain region of the first transistor, and
      a second interconnect feature that passes through the second dielectric material and contacts the gate structure of the second transistor.

13. The integrated circuit structure of claim 12, further comprising a contact structure on a bottom side of the source region or drain region of the first transistor, the contact structure comprising a metal, wherein the first interconnect feature directly contacts the contact structure, and wherein the contact structure is conformal to the bottom side of the source region or drain region of the first transistor.

14. The integrated circuit structure of claim 12, wherein the gate structure of the second transistor comprises a high-k dielectric and a gate electrode, and the second interconnect feature is in contact with the gate electrode.

15. The integrated circuit structure of claim 12, wherein the device region further comprises an isolation wall structure, the isolation wall structure including an insulation material and a conductor within the insulation material, wherein one of the first or second dielectric materials is also under the isolation wall structure.

16. The integrated circuit structure of claim 15, wherein the backside contact region further comprises a third interconnect feature that passes through the first or second dielectric material under the isolation wall structure and contacts the conductor.

17. The integrated circuit structure of claim 12, wherein the first dielectric material comprises a nitride, the second dielectric material comprises an oxide, and the non-conductive spacer comprises an oxynitride.

18. The integrated circuit structure of claim 12, wherein one or both of the first and second transistors further comprise one or more nanowires or nanoribbons or nanosheets, and the corresponding gate structure wraps around those one or more nanowires or nanoribbons or nanosheets.

19. The integrated circuit structure of claim 12, wherein one or both of the first and second transistors further comprise a fin structure, and the corresponding gate structure is on top and side walls of the fin structure.

20. The integrated circuit structure of claim 12, wherein the device region includes a lower device region and an upper device region, and the first and second transistors are part of the lower device region.

21. An integrated circuit structure comprising:
a device region comprising a first transistor, a second transistor, and a third transistor, each of the first, second, and third transistors including a source or drain region and a gate structure;
a frontside contact region above the device region, the frontside contact region including a frontside interconnect feature connected directly to at least one of the source or drain region or the gate structure of the third transistor; and
a backside contact region below the device region, the backside contact region including
a first dielectric material under the source or drain region of both the first and second transistors, a second dielectric material under the gate structure of both the first and second transistors, and a non-conductive spacer laterally between the first and second dielectric materials, wherein
one of the first dielectric material, the second dielectric material, and the non-conductive spacer is a nitride,
one of the first dielectric material, the second dielectric material, and the non-conductive spacer is an oxide, and
one of the first dielectric material, the second dielectric material, and the non-conductive spacer is an oxynitride,
such that the first and second dielectric materials are selectively etchable with respect to one another and the non-conductive spacer.

22. The integrated circuit structure of claim 21, further comprising:
a first bottom side interconnect feature that passes through the first dielectric material and contacts a bottom side of the source or drain region of the first transistor; and
a second bottom side interconnect feature that passes through the second dielectric material and contacts the gate structure of the second transistor.

23. The integrated circuit structure of claim 22, further comprising a contact structure on a bottom side of the source region or drain region of the first transistor, the contact structure comprising a metal, wherein the first bottom side interconnect feature directly contacts the contact structure, wherein the contact structure is conformal to the bottom side of the source region or drain region of the first transistor.

24. The integrated circuit structure of claim 22, wherein the gate structure of the second transistor comprises a high-k dielectric and a gate electrode, and the second bottom side interconnect feature is in contact with the gate electrode.

25. The integrated circuit structure of claim 22, wherein the device region further comprises an isolation wall structure, the isolation wall structure including an insulation material and a conductor within the insulation material, wherein one of the first or second dielectric materials is also under the isolation wall structure, and wherein the backside contact region further comprises a third bottom side interconnect feature that passes through the first or second dielectric material under the isolation wall structure and contacts the conductor.

* * * * *